(12) United States Patent
Oike et al.

(10) Patent No.: US 10,559,716 B2
(45) Date of Patent: Feb. 11, 2020

(54) SEMICONDUCTOR LIGHT EMITTING DEVICE AND METHOD FOR MANUFACTURING SAME

(71) Applicant: ALPAD CORPORATION, Chiyoda-ku (JP)

(72) Inventors: Go Oike, Nomi (JP); Hiroshi Katsuno, Komatsu (JP); Koji Kaga, Komatsu (JP); Masakazu Sawano, Nonoichi (JP); Yuxiong Ren, Nomi (JP); Kazuyuki Miyabe, Kanazawa (JP)

(73) Assignee: ALPAD CORPORATION, Chiyoda-ku (JP)

( * ) Notice: Subject to any disclaimer, the term of this patent is extended or adjusted under 35 U.S.C. 154(b) by 0 days.

(21) Appl. No.: 16/082,911

(22) PCT Filed: Mar. 8, 2017

(86) PCT No.: PCT/JP2017/009212
§ 371 (c)(1),
(2) Date: Sep. 6, 2018

(87) PCT Pub. No.: WO2017/154973
PCT Pub. Date: Sep. 14, 2017

(65) Prior Publication Data
US 2019/0088821 A1 Mar. 21, 2019

(30) Foreign Application Priority Data
Mar. 8, 2016 (JP) .................................. 2016-044327

(51) Int. Cl.
*H01L 33/22* (2010.01)
*H01L 33/50* (2010.01)
(Continued)

(52) U.S. Cl.
CPC .......... *H01L 33/22* (2013.01); *H01L 33/0016* (2013.01); *H01L 33/0075* (2013.01);
(Continued)

(58) Field of Classification Search
CPC ........... H01L 2924/12041; H01L 33/20; H01L 33/54; H01L 33/505; H01L 33/22
See application file for complete search history.

(56) References Cited

U.S. PATENT DOCUMENTS 8,404,503 B1* 3/2013 Zhu ........................ B82Y 20/00
257/E31.105
8,404,504 B1* 3/2013 Zhu ........................ H01L 33/44
257/E31.105
(Continued)

FOREIGN PATENT DOCUMENTS

EP 2 234 182 A1 9/2010
JP 2007-88277 A 4/2007
(Continued)

OTHER PUBLICATIONS

International Search Report dated May 9, 2017 in PCT/JP2017/009212 filed Mar. 8, 2017.

*Primary Examiner* — Ngan V Ngo
(74) *Attorney, Agent, or Firm* — Oblon, McClelland, Maier & Neustadt, L.L.P.

(57) ABSTRACT

A semiconductor light emitting device according to an embodiment includes a stacked body. The stacked body includes a first semiconductor layer of a first conductivity type, a light emitting layer is provided on the first semiconductor layer, and a second semiconductor layer of a second conductivity type provided on the light emitting layer. The stacked body includes a first protrusion on an upper surface of the stacked body. The first protrusion protrudes in a first direction from the first semiconductor layer to the light emitting layer. Length of the first protrusion in a second
(Continued)

direction perpendicular to the first direction decreases toward the first direction. The first protrusion includes a first portion and a second portion. The first portion has a first side surface inclined with respect to the first direction. The second portion is provided below the first portion and having a second side surface inclined with respect to the first direction. The second side surface is curved so as to be convex downward.

10 Claims, 23 Drawing Sheets

(51) Int. Cl.
    *H01L 33/54*     (2010.01)
    *H01L 33/20*     (2010.01)
    *H01L 33/00*     (2010.01)
    *H01L 33/32*     (2010.01)

(52) U.S. Cl.
    CPC .............. *H01L 33/20* (2013.01); *H01L 33/32* (2013.01); *H01L 33/505* (2013.01); *H01L 33/54* (2013.01); *H01L 2924/12041* (2013.01)

(56) References Cited

U.S. PATENT DOCUMENTS

| | | | |
|---|---|---|---|
| 2009/0014751 A1* | 1/2009 | Kim | H01L 33/22 257/103 |
| 2011/0019435 A1* | 1/2011 | Teng | G02B 3/0043 362/608 |
| 2011/0089452 A1* | 4/2011 | Jeong | H01L 33/405 257/98 |
| 2011/0220933 A1 | 9/2011 | Gotoda et al. | |
| 2012/0276668 A1* | 11/2012 | Muramoto | H01L 33/0095 438/28 |
| 2014/0103391 A1 | 4/2014 | Haruta et al. | |
| 2014/0166975 A1* | 6/2014 | Ito | H01L 33/22 257/13 |
| 2014/0353582 A1 | 12/2014 | Kim et al. | |
| 2014/0367722 A1* | 12/2014 | Im | H01L 33/0079 257/98 |
| 2015/0155437 A1* | 6/2015 | Singh | H01L 33/22 257/95 |
| 2015/0372196 A1* | 12/2015 | Matsumura | H01L 33/36 257/99 |
| 2016/0197238 A1* | 7/2016 | Jeong | H01L 33/38 257/98 |
| 2016/0211417 A1* | 7/2016 | Katsuno | H01L 33/405 |
| 2019/0094448 A1* | 3/2019 | Watanabe | F21S 2/00 |
| 2019/0280154 A1* | 9/2019 | Oh | H01L 23/62 |

FOREIGN PATENT DOCUMENTS

| | | |
|---|---|---|
| JP | 2008-60331 A | 3/2008 |
| JP | 2009-10215 A | 1/2009 |
| JP | 2011-187736 A | 9/2011 |
| JP | 2014-229648 A | 12/2014 |
| JP | 2015-509663 A | 3/2015 |
| WO | WO 2012/141169 A1 | 10/2012 |

* cited by examiner

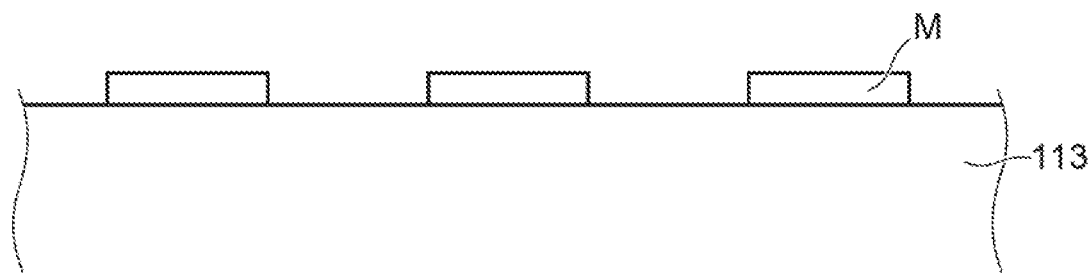
FIG. 7A
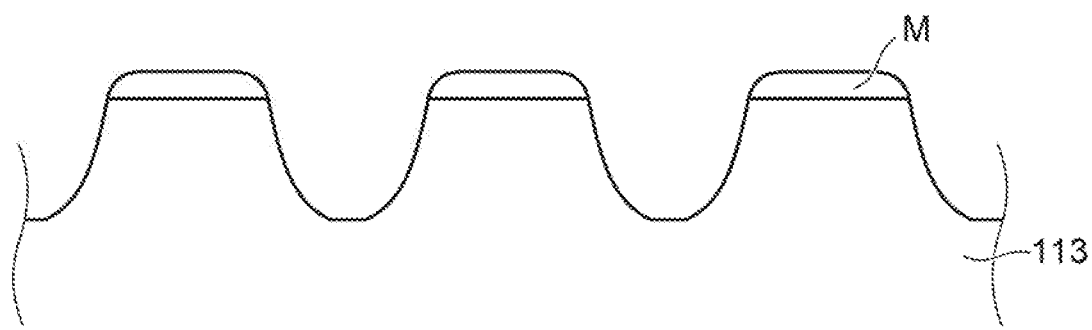
FIG. 7B
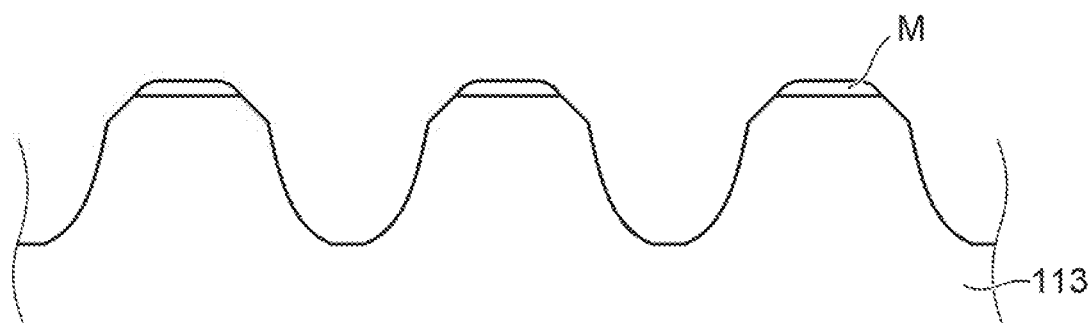
FIG. 7C
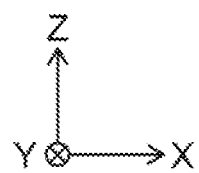

SEMICONDUCTOR LIGHT EMITTING DEVICE AND METHOD FOR MANUFACTURING SAME

TECHNICAL FIELD

Embodiments of the invention relate to a semiconductor light emitting device and a method for manufacturing the same.

BACKGROUND ART

A semiconductor light emitting device includes a p-type semiconductor layer, a light emitting layer, and an n-type semiconductor layer. By application of voltage to the semiconductor light emitting device and injection of carriers into the light emitting layer, light is emitted from the light emitting layer. It is desired that the light emitted from the light emitting layer be efficiently extracted to the outside of the semiconductor light emitting device.

CITATION LIST

Patent Literature

[Patent Citation 1] JP 2008-60331 A

SUMMARY

Technical Problem

A problem to be solved by the invention is to provide a semiconductor light emitting device and a method for manufacturing the same capable of improving the light extraction efficiency.

Solution to Problem

A semiconductor light emitting device according to an embodiment includes a stacked body. The stacked body includes a first semiconductor layer of a first conductivity type, a light emitting layer is provided on the first semiconductor layer, and a second semiconductor layer of a second conductivity type provided on the light emitting layer. The stacked body includes a first protrusion on an upper surface of the stacked body. The first protrusion protrudes in a first direction from the first semiconductor layer to the light emitting layer. Length of the first protrusion in a second direction perpendicular to the first direction decreases toward the first direction. The first protrusion includes a first portion and a second portion. The first portion has a first side surface inclined with respect to the first direction. The second portion is provided below the first portion and having a second side surface inclined with respect to the first direction. The second side surface is curved so as to be convex downward.

BRIEF DESCRIPTION OF DRAWINGS

FIG. 7A to 7C are enlarged process sectional views showing the process for manufacturing the semiconductor light emitting device according to the first embodiment.

DETAILED DESCRIPTION

Embodiments of the invention will now be described with reference to the drawings.

The drawings are schematic or conceptual. The relationship between the thickness and the width of portions, the proportion of size between portions, etc., are not necessarily the same as the actual values thereof. The dimension and/or the proportion may be illustrated differently between the drawings, even in the case where the same portion is illustrated.

In the description and the drawings, the same elements as already described are marked with the same numerals, and a detailed description thereof is omitted as appropriate.

An XYZ orthogonal coordinate system is used in describing the embodiments. The direction from the p-type semiconductor layer 109 to the light emitting layer 111 is referred to as Z-direction (first direction). The directions perpendicular to the Z-direction and orthogonal to each other are referred to as X-direction (second direction) and Y-direction.

First Embodiment

Figure 1:
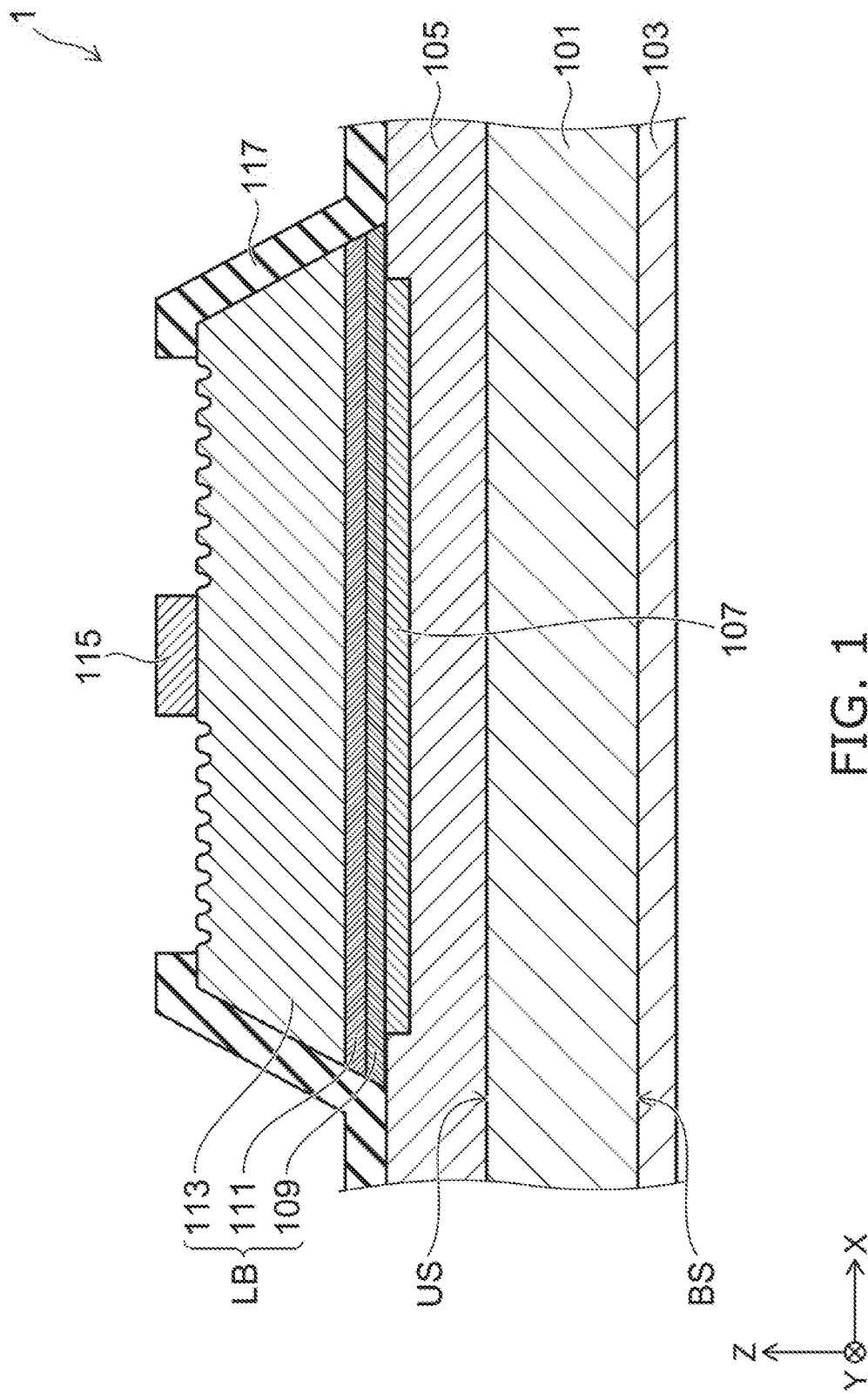
FIG. 1 is a sectional view showing a semiconductor light emitting device 1 according to a first embodiment.

FIG. 1 is a sectional view showing a semiconductor light emitting device 1 according to a first embodiment.

The semiconductor light emitting device 1 is e.g. a light emitting diode of the vertical conduction type.

As shown in FIG. 1, the semiconductor light emitting device 1 includes a substrate 101, a p-side electrode 103, a metal layer 105, a contact layer 107, a stacked body LB, an n-side electrode 115, and an insulating layer 117. The stacked body LB includes a p-type semiconductor layer 109, a light emitting layer 111, and an n-type semiconductor layer 113.

The substrate 101 is e.g. a silicon substrate. The substrate 101 has an upper surface US and a lower surface BS opposed to each other.

The p-side electrode 103 is provided on the lower surface BS of the substrate 101. The p-side electrode 103 contains e.g. metal such as gold, nickel, titanium, and aluminum.

The metal layer 105 is provided on the upper surface US of the substrate 101. The metal layer 105 contains e.g. tin.

The contact layer 107 is provided on the metal layer 105. The contact layer 107 is further surrounded with the metal layer 105 along the X-Y plane. The contact layer 107 has a structure in which e.g. a nickel layer and a silver layer are stacked.

The p-type semiconductor layer 109 is provided on the metal layer 105 and the contact layer 107. The p-type semiconductor layer 109 is in ohmic contact with the contact layer 107. The p-type semiconductor layer 109 is e.g. a gallium nitride layer containing p-type impurity. The p-type impurity can be e.g. magnesium.

The light emitting layer 111 is provided on the p-type semiconductor layer 109. The light emitting layer 111 is e.g. an undoped gallium nitride layer. Here, "undoped" means that there is no intentional doping with impurity.

The n-type semiconductor layer 113 is provided on the light emitting layer 111. The n-type semiconductor layer 113 is e.g. a gallium nitride layer containing n-type impurity. The n-type impurity can be e.g. silicon. The upper surface of the stacked body LB (the upper surface of the n-type semiconductor layer 113) is roughened to form an asperity structure.

The n-side electrode 115 is provided on part of the n-type semiconductor layer 113. The n-side electrode 115 is in ohmic contact with the n-type semiconductor layer 113. The n-side electrode 115 contains metal such as platinum, gold, nickel, titanium, and aluminum.

The insulating layer 117 is provided around the stacked body LB along the X-Y plane and covers the upper surface of the metal layer 105. The roughened upper surface of the stacked body LB and the n-side electrode 115 are not covered with the insulating layer 117 but exposed.

In operation of the semiconductor light emitting device 1, holes are injected from the p-type semiconductor layer 109 into the light emitting layer 111, and electrons are injected from the n-type semiconductor layer 113 into the light emitting layer 111. Holes and electrons are recombined in the light emitting layer 111. Thus, light is emitted from the light emitting layer 111. The light emitted from the light emitting layer 111 is extracted outside through the upper surface of the stacked body LB.

Figure 2:
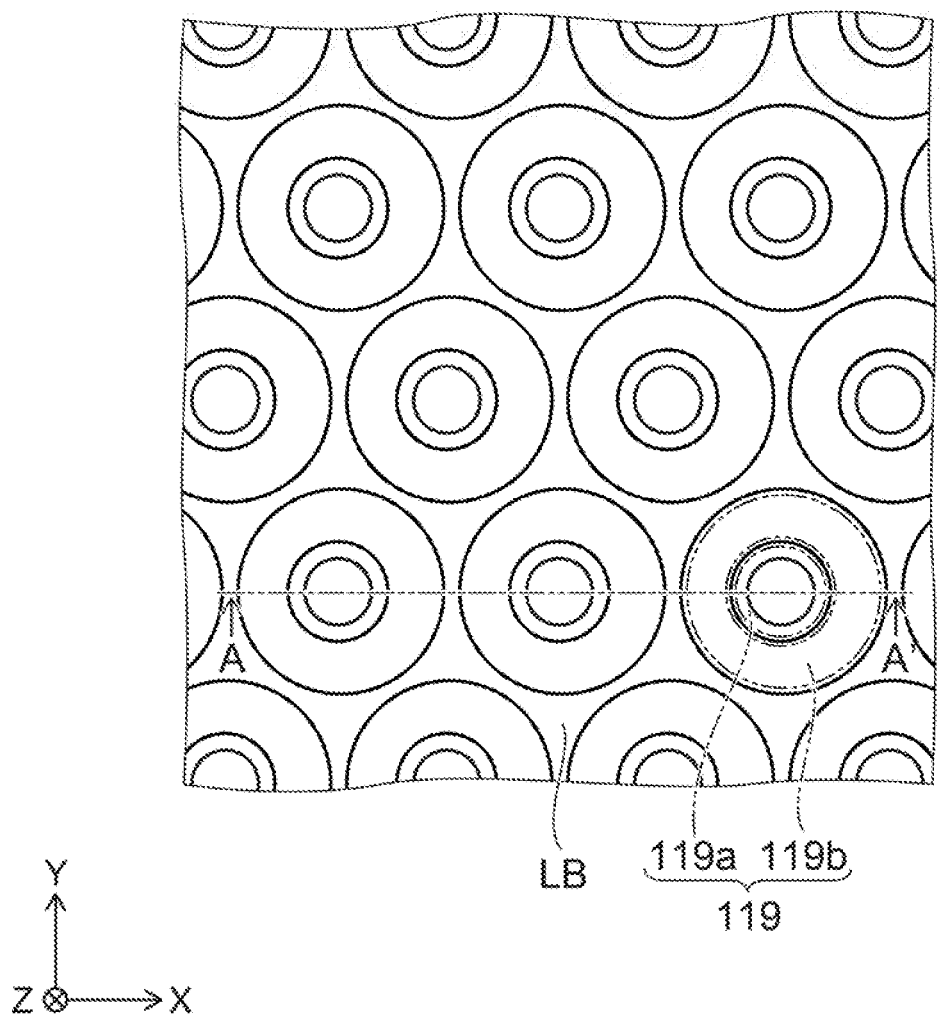
FIG. 2 is an enlarged plan view showing part of the upper surface of the semiconductor light emitting device according to the first embodiment.

FIG. 2 is an enlarged plan view showing part of the upper surface of the semiconductor light emitting device 1 according to the first embodiment.

Figure 3:
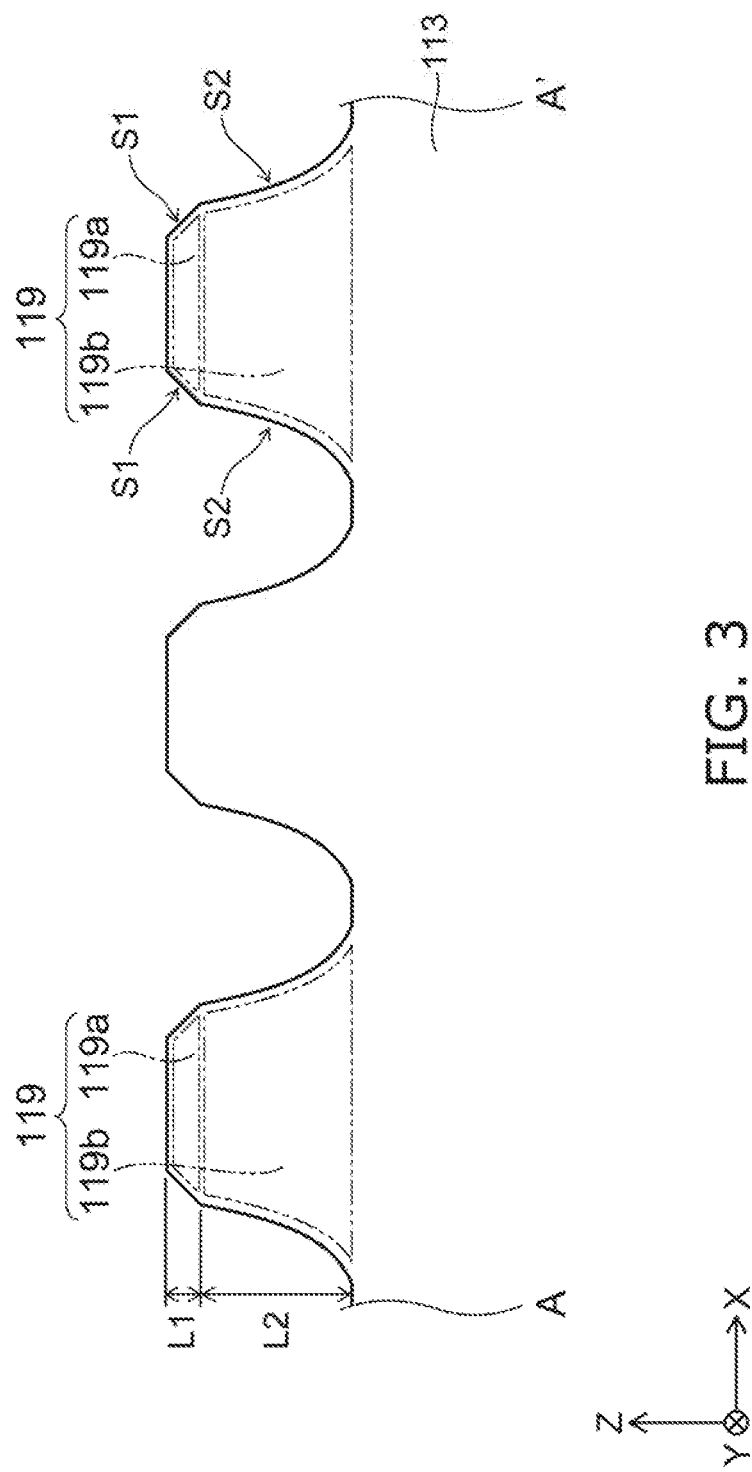
FIG. 3 is a sectional view taken along A-A' in FIG. 2.

FIG. 3 is a sectional view taken along A-A' in FIG. 2.

As shown in FIG. 2, a plurality of protrusions 119 are provided on the upper surface of the stacked body LB. In the example shown in FIG. 2, six protrusions 119 are arranged around one protrusion 119. However, the arrangement of the plurality of protrusions 119 is arbitrary.

As shown in FIG. 3, the protrusion 119 has a first portion 119a and a second portion 119b. The first portion 119a is located in the upper part of the protrusion 119. The second portion 119b is provided below the first portion 119a and located in the lower part of the protrusion 119.

The upper surface of the protrusion 119 is perpendicular to e.g. the Z-direction. The width (length in the X-direction and the Y-direction) of the protrusion 119 is narrower toward the Z-direction. Thus, the side surface S1 of the first portion 119a and the side surface S2 of the second portion 119b are inclined with respect to the Z-direction. The side surface S2 is curved so as to be convex downward. The inclination of at least part of the side surface S2 with respect to the Z-direction is smaller than the inclination of the side surface S1 with respect to the Z-direction.

In the sectional view shown in FIG. 3, the side surface S1 is parallel to a direction inclined with respect to the Z-direction. However, the side surface S1 may be curved so as to be convex upward.

The first portion 119a and the second portion 119b are provided so that e.g. the length L2 in the Z-direction of the second portion 119b is longer than the length L1 in the Z-direction of the first portion 119a.

Next, an example of the method for manufacturing the semiconductor light emitting device 1 according to the first embodiment is described with reference to FIGS. 4A to 7C.

FIGS. 4A to 6B are process sectional views showing the process for manufacturing the semiconductor light emitting device 1 according to the first embodiment.

FIG. 7A to 7C are enlarged process sectional views showing the process for manufacturing the semiconductor light emitting device 1 according to the first embodiment.

Figure 4A:
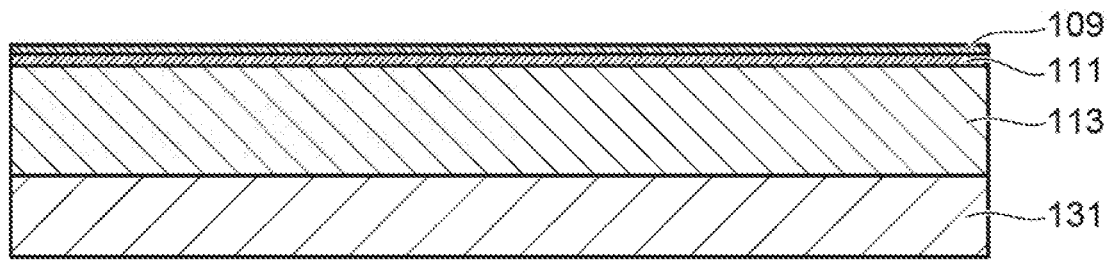
FIGS. 4A to 4C are process sectional views showing the process for manufacturing the semiconductor light emitting device according to the first embodiment.

First, a substrate 131 for growing a nitride semiconductor layer is prepared. The substrate 131 is e.g. a silicon substrate, a sapphire substrate, or a gallium nitride substrate. An n-type semiconductor layer 113, a light emitting layer 111, and a p-type semiconductor layer 109 are sequentially epitaxially grown on this substrate 131 (FIG. 4A).

Figure 4B:
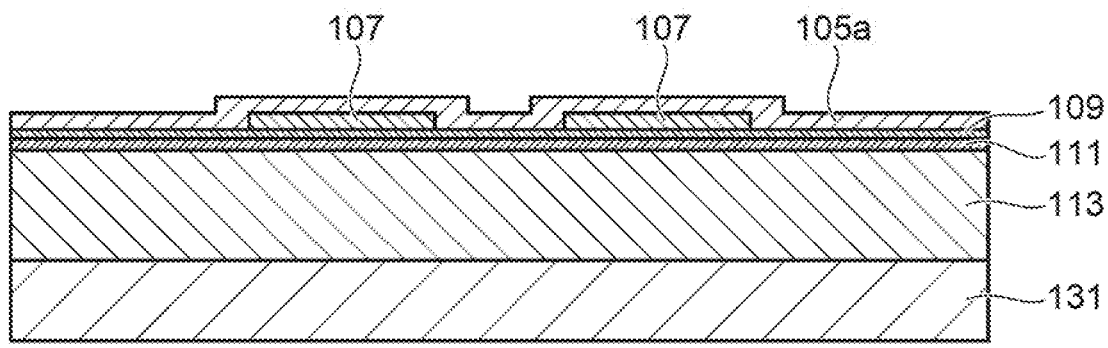
Figure 4C:
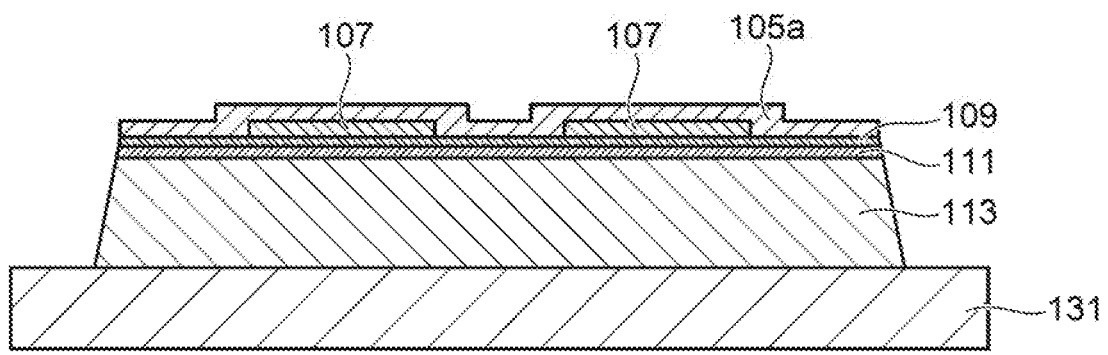

Next, a contact layer 107 is formed on part of the p-type semiconductor layer 109. Subsequently, a metal layer 105a is formed on the p-type semiconductor layer 109 so as to cover the contact layer 107 (FIG. 4B). Subsequently, the n-type semiconductor layer 113, the light emitting layer 111, the p-type semiconductor layer 109, and the metal layer 105a are patterned to remove part of each outer periphery (FIG. 4C).

Figure 5A:
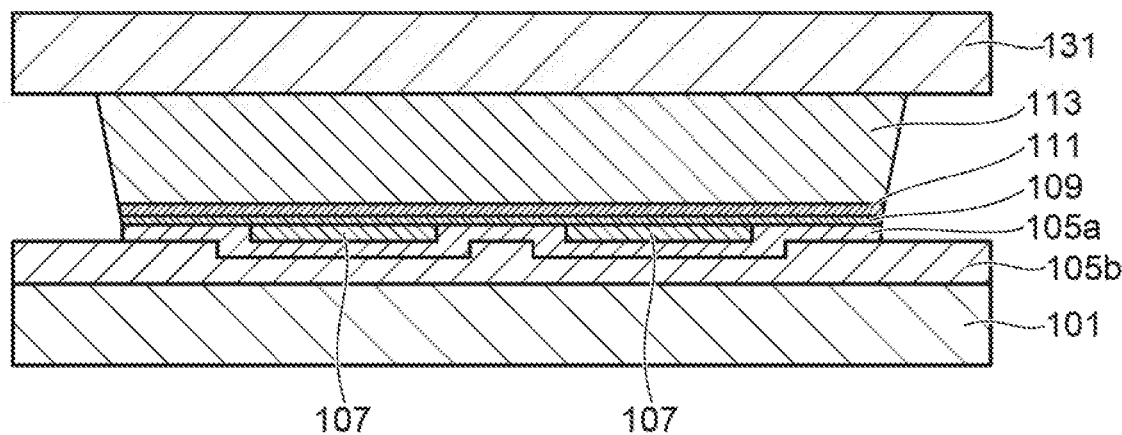
FIGS. 5A to 5C are process sectional views showing the process for manufacturing the semiconductor light emitting device according to the first embodiment.

Next, another substrate 101 different from the substrate 131 is prepared. A metal layer 105b is formed on the substrate 101. Subsequently, the metal layer 105a provided on the substrate 131 and the metal layer 105b provided on the substrate 101 are bonded to each other (FIG. 5A). The metal layers 105a and 105b bonded together forms a metal layer 105 shown in FIG. 1.

Figure 5B:
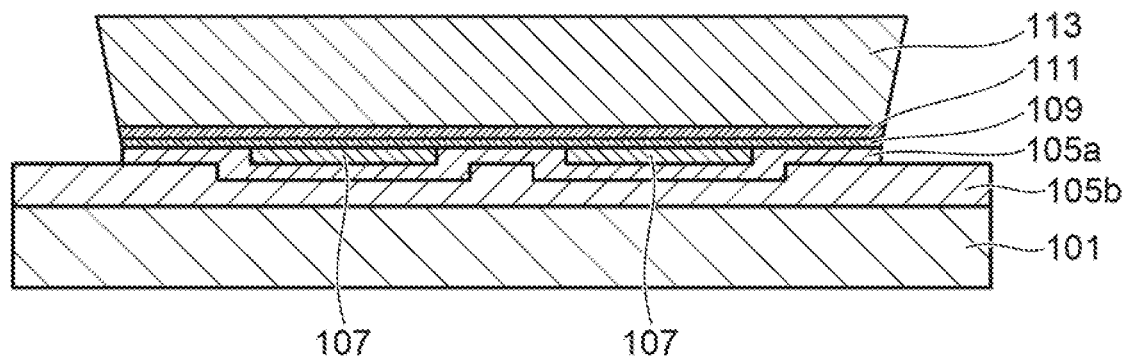
Figure 5C:
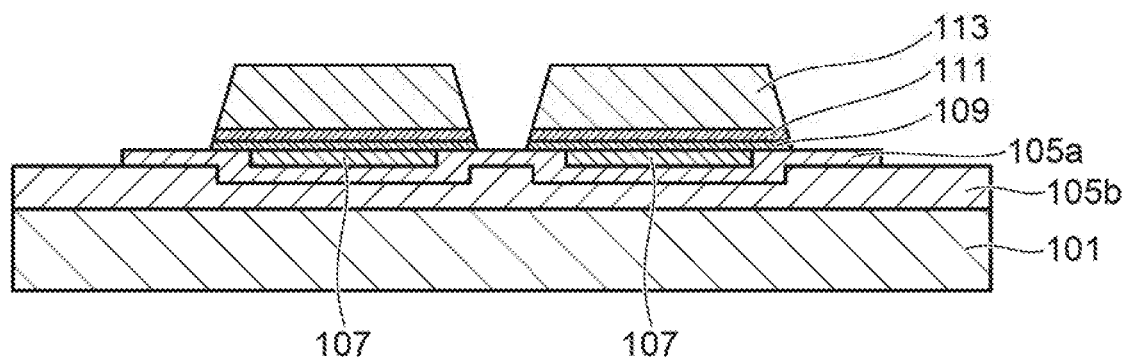

Next, the substrate 131 is stripped by irradiation with UV light from the substrate 131 side (FIG. 5B). Subsequently, the p-type semiconductor layer 109, the light emitting layer 111, and the n-type semiconductor layer 113 are patterned. Thus, a stacked body including the p-type semiconductor layer 109, the light emitting layer 111, and the n-type semiconductor layer 113 is formed on each contact layer 107 (FIG. 5C).

Figure 6A:
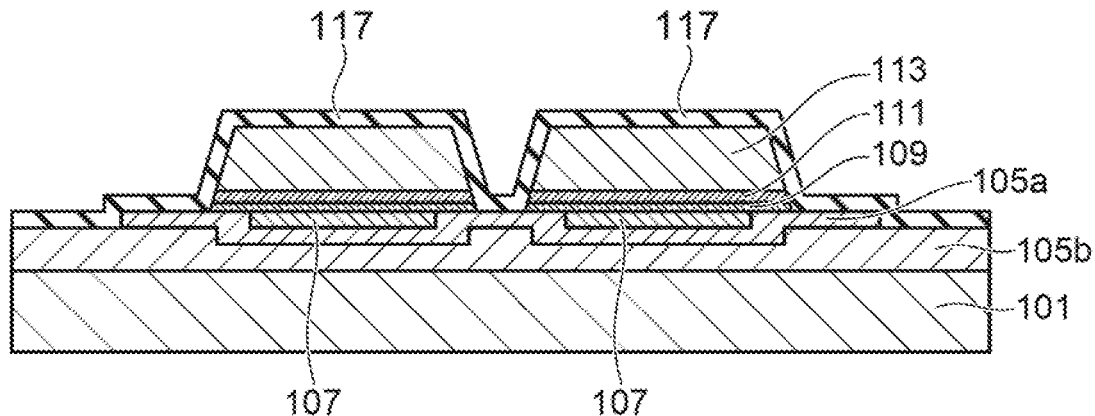
FIGS. 6A and 6B are process sectional views showing the process for manufacturing the semiconductor light emitting device according to the first embodiment.
Figure 6B:
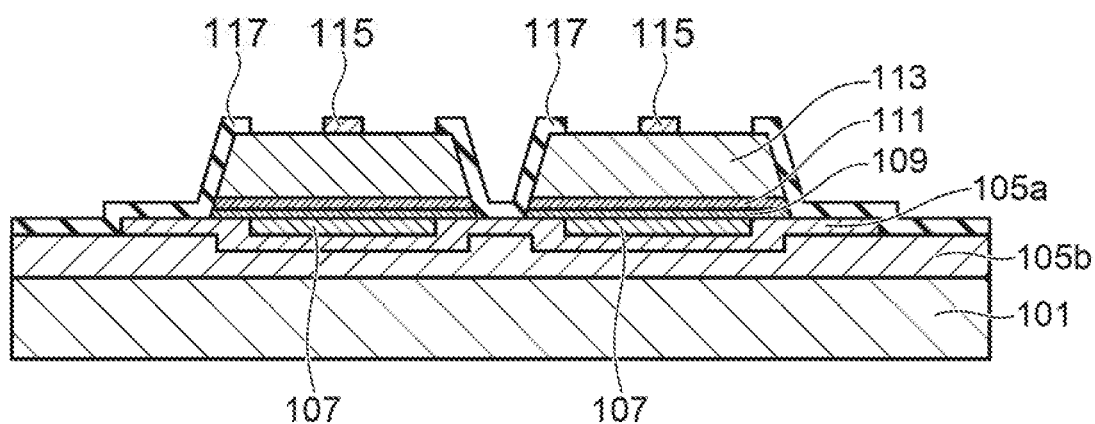

Next, an insulating layer 117 covering the p-type semiconductor layer 109, the light emitting layer 111, and the n-type semiconductor layer 113 is formed (FIG. 6A). Subsequently, part of the insulating layer 117 is removed so as to expose part of the upper surface of each n-type semiconductor layer 113. An n-side electrode 115 is formed on part of the exposed upper surface of the n-type semiconductor layer 113 (FIG. 68B).

In the following, the state of part of the upper surface of the n-type semiconductor layer 113 is described with reference to FIGS. 7A to 7C.

FIGS. 7A to 7C show the state of part of the upper surface of the n-type semiconductor layer 113 in enlarged view.

After forming the n-side electrode 115, a resist film is applied onto the n-type semiconductor layer 113. This resist film is patterned by photolithography to form a resist mask M (FIG. 7A).

Next, the resist mask M is used to etch the n-type semiconductor layer 113 by the RIE (reactive ion etching) method. At this time, the n-type semiconductor layer 113 is etched, and the resist mask M is also etched. The etching rate for the corner part of the resist mask M is higher than the etching rate for the upper surface and the side surface of the resist mask M. Thus, the width of the upper part of the resist mask M is gradually narrowed (FIG. 7B). Further continuing etching in this state also narrows the width of the lower part of the resist mask M, and exposes part of the n-type semiconductor layer 113 originally covered with the resist mask M. Then, the newly exposed part of the n-type semiconductor layer 113 is etched (FIG. 7C).

At this time, in the portion of the n-type semiconductor layer 113 which was exposed at the time of forming the resist mask M, etching proceeds with the etched surface curved downward. On the other hand, in the newly exposed part of the n-type semiconductor layer 113, etching proceeds so that the etched surface is parallel to a direction inclined with respect to the Z-direction. Alternatively, etching proceeds so that the etched surface protrudes upward.

It is considered that such etching occurs for the following reason.

The etching process from FIGS. 7A to 7B is performed by e.g. the RIE method in which the acceleration voltage is set low. In the RIE method, part of the n-type semiconductor layer 113 is removed to form a depression. At this time, redeposition of the etched material occurs in the region from the corner of the bottom part of the depression to the lower end of the resist mask M. This redeposited material suppresses etching of the n-type semiconductor layer 113 directly below the resist mask M. Furthermore, the low setting of the acceleration voltage lowers anisotropy of etching and suppresses re-etching of the redeposited material. Thus, the inner wall of the depression is curved so as to be convex downward.

In the inner wall of this depression, etching proceeds while keeping the curved shape also in the process from FIGS. 78 to 7C. Thus, the side surface S2 shown in FIGS. 2 and 3 is formed.

In the process from FIGS. 7B to 7C, the width of the resist mask M decreases. Thus, another part of the n-type semiconductor layer 113 is exposed and etched. At this time, the n-type semiconductor layer 113 is gradually exposed from the outer periphery side of the resist mask M. Thus, the etching amount of the n-type semiconductor layer 113 increases from the center side toward the outer periphery of the resist mask M. The etched surface is inclined downward from the center side toward the outer periphery of the resist mask M. Thus, the side surface S1 shown in FIGS. 2 and 3 is formed.

Accordingly, a protrusion 119 having a first portion 119a and a second portion 119b is formed.

Then, a p-side electrode 103 is formed on the lower surface of the substrate 101. Thus, the semiconductor light emitting device 1 shown in FIGS. 1 to 3 is obtained.

Here, the function and effect according to this embodiment are described.

According to this embodiment, the protrusion 119 has a first portion 119a, and a second portion 119b with the side surface curved so as to be convex downward. According to such a configuration, the surface area of the upper surface of the stacked body LB can be made larger than in the case where the side surface of the protrusion 119 is uniformly inclined.

The light emitted from the light emitting layer 111 repeats irregular reflection in each semiconductor layer. This generates light beams traveling in various directions in the semiconductor light emitting device. Thus, the amount of light incident on the interface between the upper surface of the stacked body LB and the outside from inside the stacked body LB does not significantly depend on the inclination of each portion of the interface with respect to the Z-direction. Furthermore, the amount of external light extraction per unit area at the interface does not significantly depend on the inclination of the interface. Thus, the amount of light extracted outside from the stacked body LB can be increased by increasing the surface area of the upper surface of the stacked body LB. This can improve the efficiency of light extraction from the semiconductor light emitting device.

Here, the side surface S2 of the second portion 119b is curved so as to be convex downward. This can reduce the possibility that the light extracted outside from the n-type semiconductor layer 113 through the side surface S2 is incident on the side surface of the adjacent protrusion 119 compared with the case where the side surface S2 is curved so as to be convex upward. The efficiency of light extraction from the semiconductor light emitting device can be improved by reducing the possibility that the extracted light is incident on the side surface of the adjacent protrusion 119.

The side surface of the second portion 119b provided below the first portion 119a (in the lower part of the protrusion 119) is curved. Thus, the surface area of the side surface of the protrusion 119 can be made larger than in the case where the side surface of the first portion 119a is curved.

Furthermore, the length L2 in the Z-direction of the second portion 119b is made longer than the length L1 in the Z-direction of the first portion 119a. This can further increase the surface area of the side surface of the protrusion 119.

(First Variation)

Figure 8:
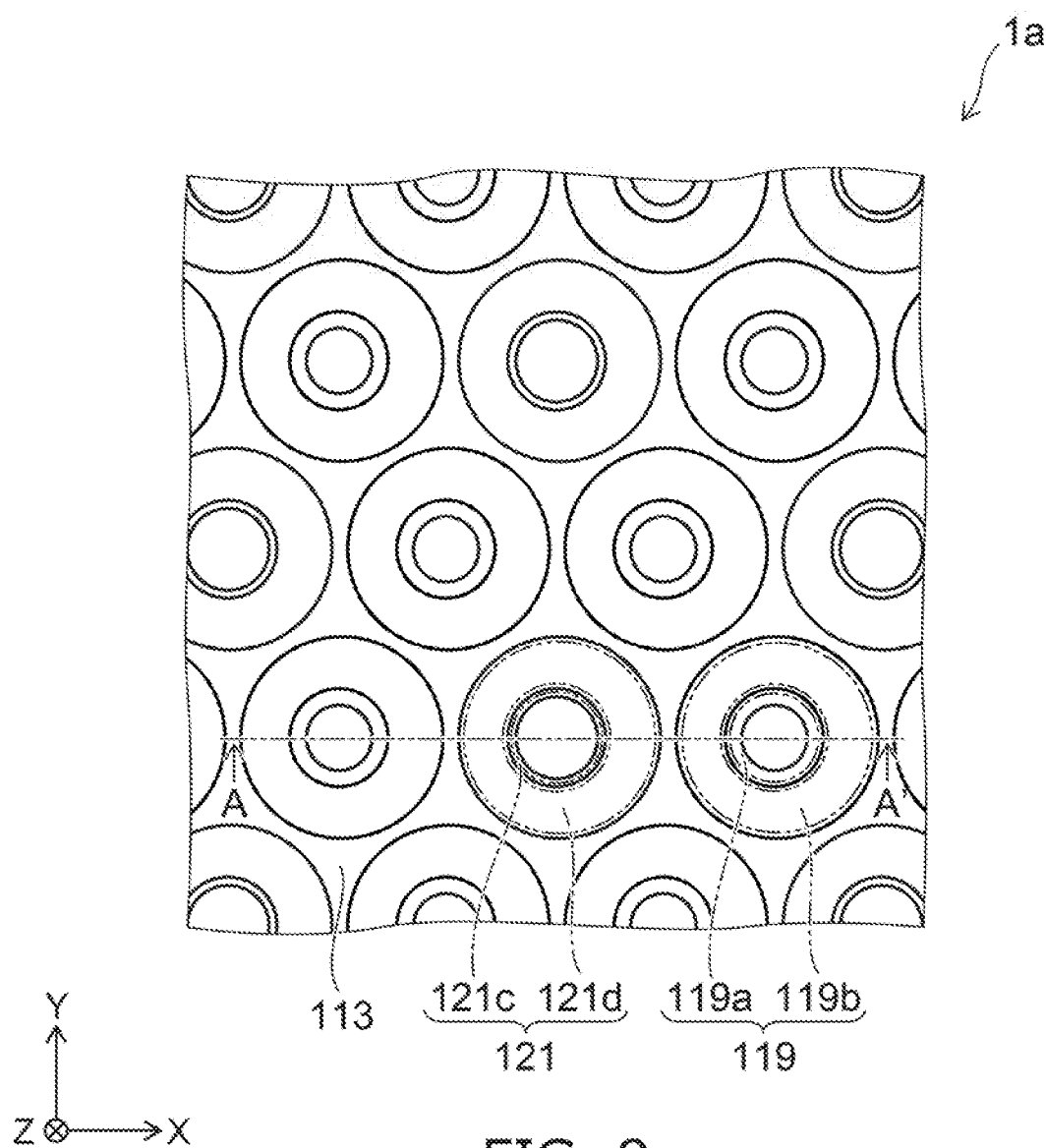
FIG. 8 is an enlarged plan view showing part of the upper surface of a semiconductor light emitting device according to a first variation of the first embodiment.

FIG. 8 is an enlarged plan view showing part of the upper surface of a semiconductor light emitting device 1a according to a first variation of the first embodiment.

Figure 9:
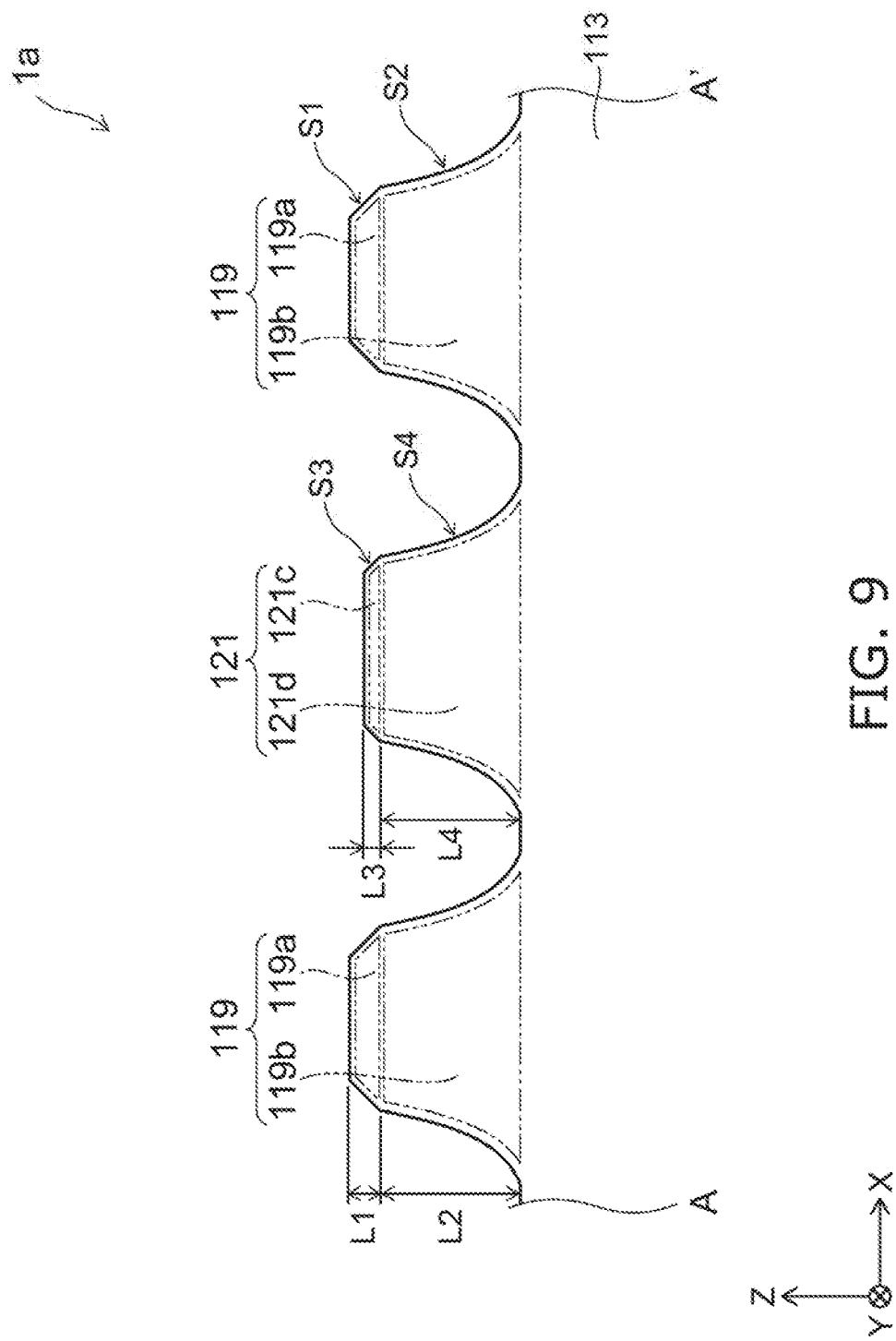
FIG. 9 is a sectional view taken along A-A' in FIG. 8.

FIG. 9 is a sectional view taken along A-A' in FIG. 8.

As shown in FIG. 8, in the semiconductor light emitting device 1a, a plurality of protrusions 119 and a plurality of protrusions 121 are provided on the upper surface of the stacked body LB. The plurality of protrusions 119 and the plurality of protrusions 121 are arranged so that at least one protrusion 119 is adjacent to one protrusion 121.

As shown in FIG. 9, as in the semiconductor light emitting device 1, the protrusion 119 has a first portion 119a and a second portion 119b. The protrusion 121 has a third portion 121c and a fourth portion 121d. The third portion 121c is located in the upper part of the protrusion 121. The fourth portion 121d is provided below the third portion 121c and located in the lower part of the protrusion 121.

The upper surface of the protrusion 121 is perpendicular to e.g. the Z-direction. The width (length in the X-direction and the Y-direction) of the protrusion 121 is narrower toward the Z-direction. Thus, the side surface S3 of the third portion 121c and the side surface S4 of the fourth portion 121d are inclined with respect to the Z-direction. The side surface S4 is curved so as to be convex downward. Furthermore, the side surface S3 may be curved so as to be convex upward. The inclination of at least part of the side surface S4 with respect to the Z-direction is smaller than the inclination of the side surface S3 with respect to the Z-direction.

The height of the protrusion 121 is lower than the height of the protrusion 119. More specifically, the length L4 in the Z-direction of the fourth portion 121d is generally equal to the length L2 in the Z-direction of the second portion 119b. On the other hand, the length L3 in the Z-direction of the third portion 121c is shorter than the length L1 in the Z-direction of the first portion 119a.

Thus, the protrusion 121 having a lower height than the protrusion 119 is provided. This can reduce the possibility that the light extracted from the protrusion 119 is incident on the side surface of the protrusion 121. Thus, the light extraction efficiency of the semiconductor light emitting device can be improved.

Here, as shown in FIG. 9, the height of the protrusion 121 is lowered so that the length L4 is longer than the length L3. This can suppress the decrease of the surface area in the side surface of the protrusion 121.

(Second Variation)

Figure 10:
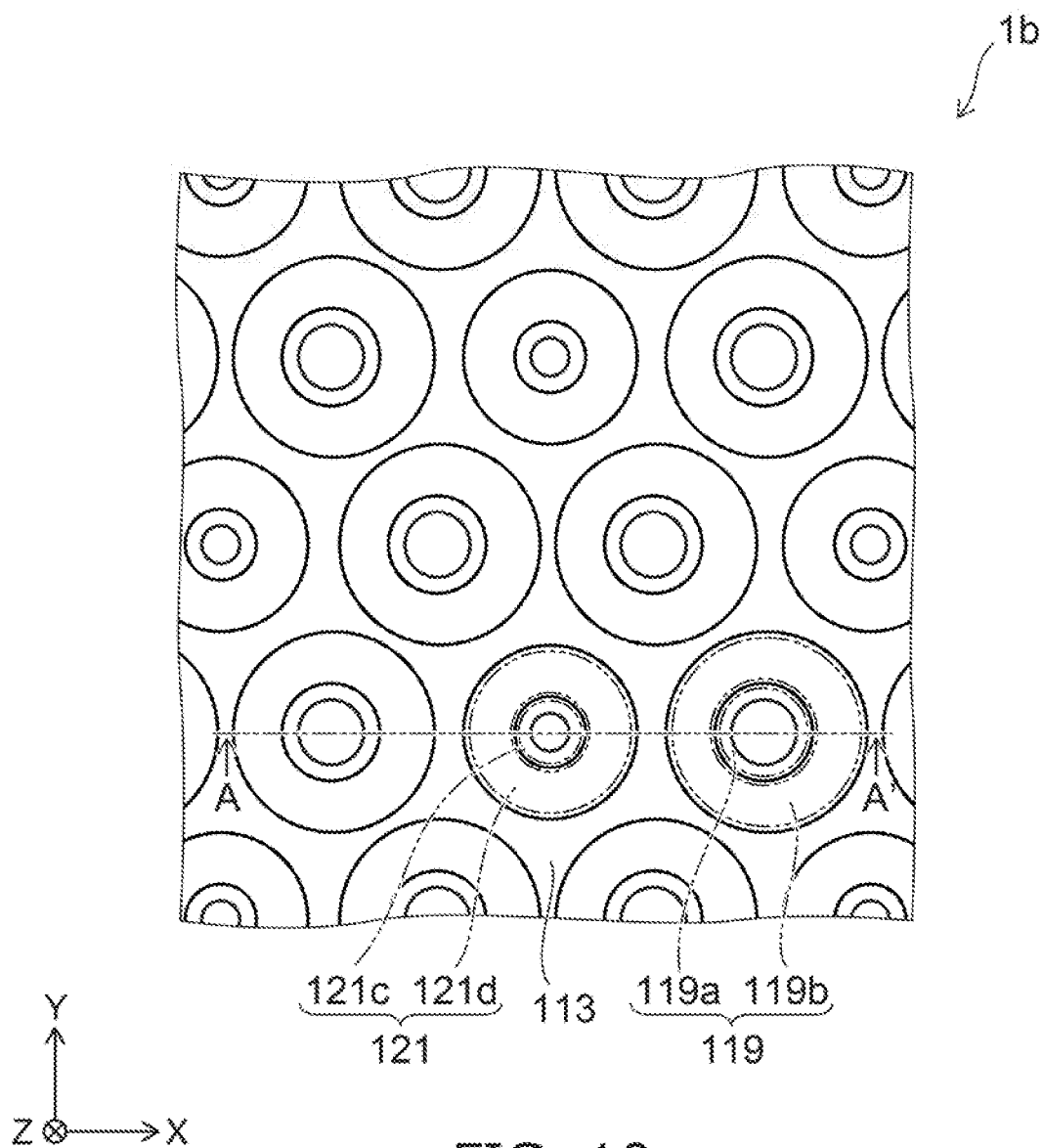
FIG. 10 is an enlarged plan view showing part of the upper surface of a semiconductor light emitting device according to a second variation of the first embodiment.

FIG. 10 is an enlarged plan view showing part of the upper surface of a semiconductor light emitting device 1b according to a second variation of the first embodiment.

Figure 11:
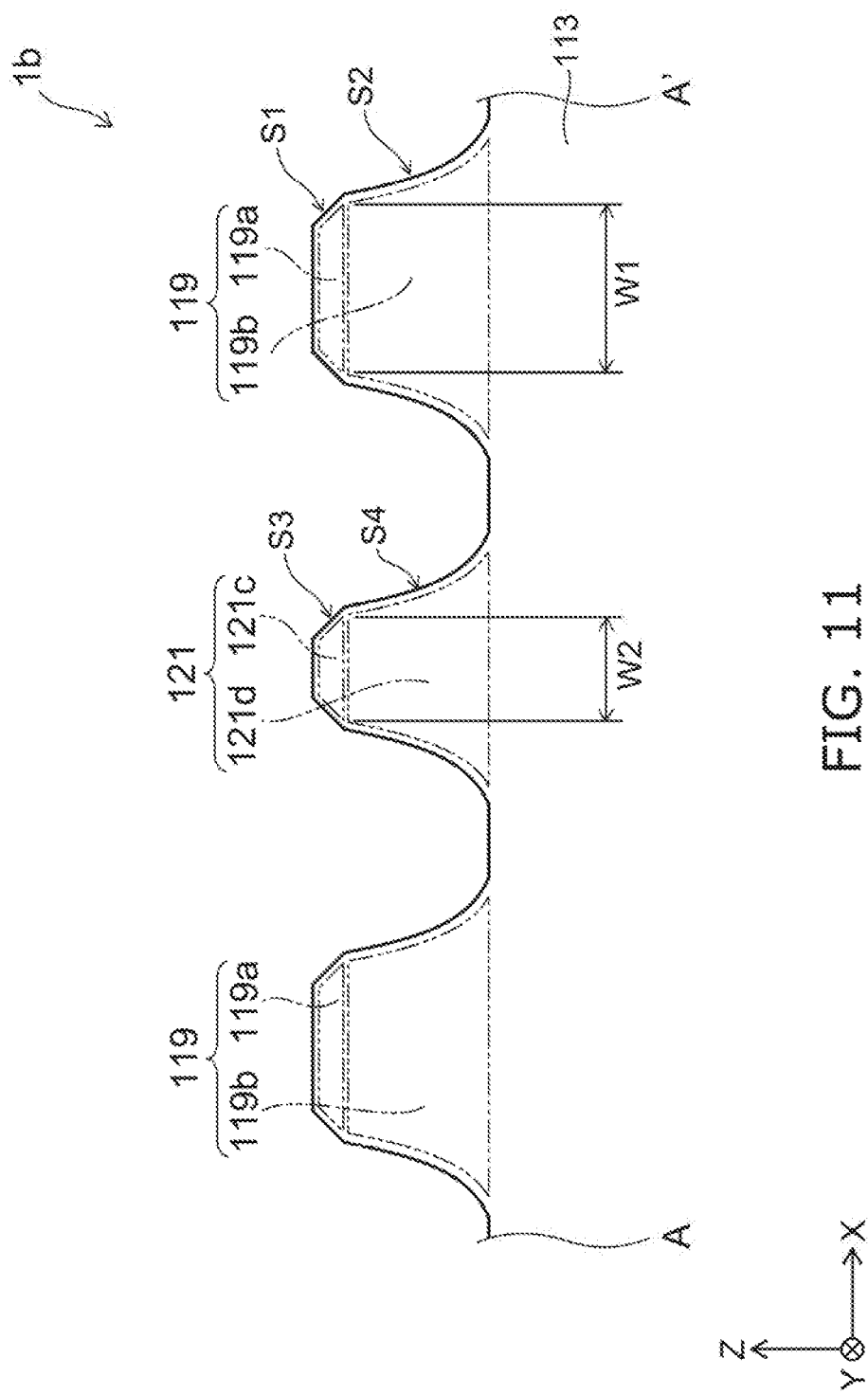
FIG. 11 is a sectional view taken along A-A' in FIG. 10.

FIG. 11 is a sectional view taken along A-A' in FIG. 10.

In the semiconductor light emitting device 1b, a plurality of protrusions 119 and a plurality of protrusions 121 are provided on the upper surface of the stacked body LB as in the semiconductor light emitting device 1a. The plurality of protrusions 119 and the plurality of protrusions 121 are arranged so that at least one protrusion 119 is adjacent to one protrusion 121. The spacing between the protrusion 119 and the protrusion 121 is wider than the spacing between the protrusions 119.

As shown in FIG. 11, as in the semiconductor light emitting device 1, the protrusion 119 has a first portion 119a and a second portion 119b. The protrusion 121 has a third portion 121c and a fourth portion 121d. The third portion 121c is located in the upper part of the protrusion 121. The fourth portion 121d is provided below the third portion 121c and located in the lower part of the protrusion 121.

In the protrusion 121, as in the semiconductor light emitting device 1a, the side surface S3 of the third portion 121c and the side surface S4 of the fourth portion 121d are inclined with respect to the Z-direction. The side surface S4 is curved so as to be convex downward.

Comparing the protrusion 119 with the protrusion 121 at the same position in the Z-direction, the width of the protrusion 121 is narrower than the width of the protrusion 119. Thus, for instance, the width W1 at the lower end of the third portion 121c (the upper end of the fourth portion 121d) is narrower than the width W2 at the lower end of the first portion 119a (the upper end of the second portion 119b).

Thus, the protrusion 121 having a narrower width than the protrusion 119 is provided. This can reduce the possibility that the light extracted from the protrusion 119 is incident on the side surface of the protrusion 121 compared with the semiconductor light emitting device 1. Thus, the light extraction efficiency of the semiconductor light emitting device can be improved.

(Third Variation)

Figure 12:
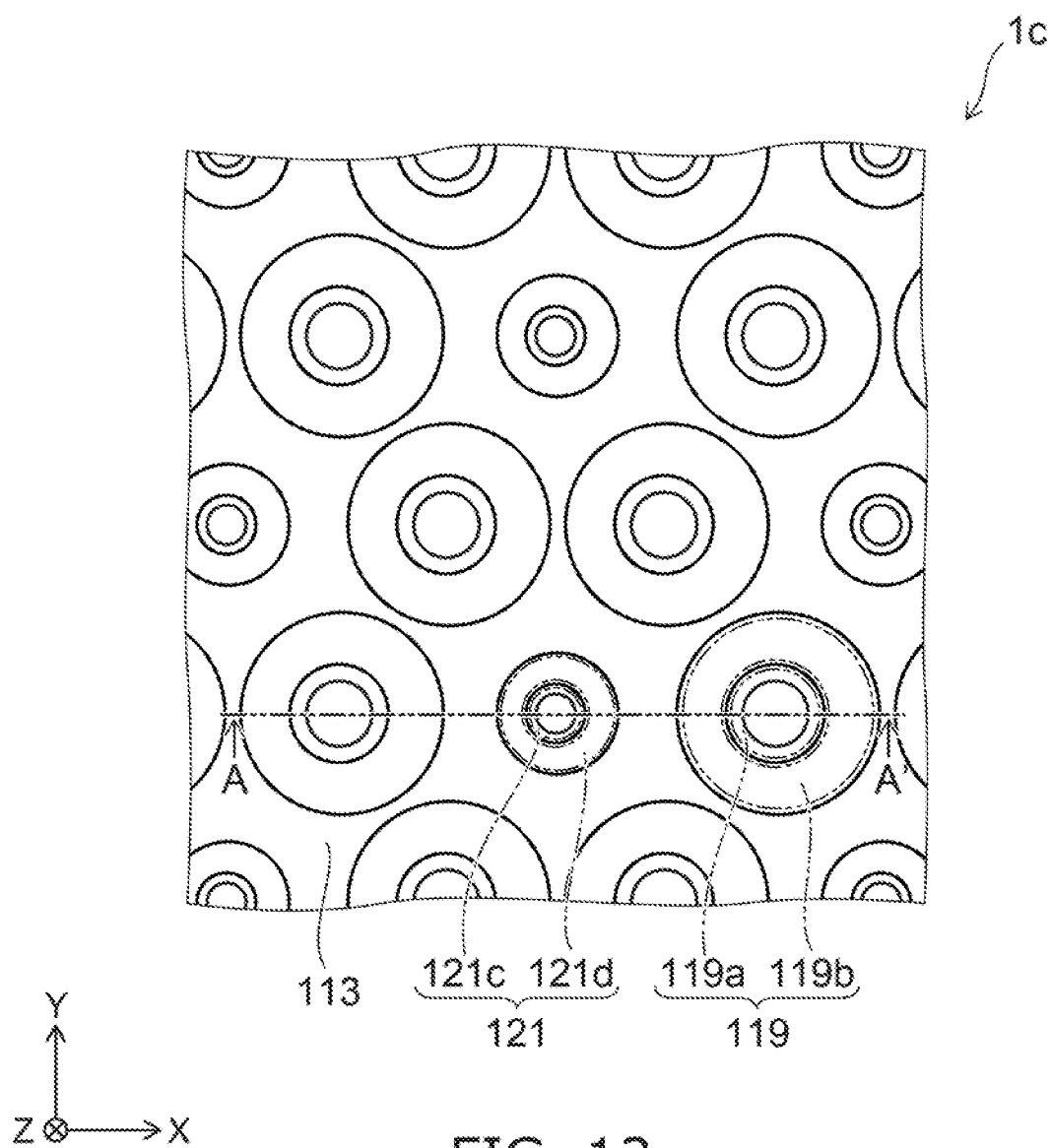
FIG. 12 is an enlarged plan view showing part of the upper surface of a semiconductor light emitting device according to a third variation of the first embodiment.

FIG. 12 is an enlarged plan view showing part of the upper surface of a semiconductor light emitting device 1c according to a third variation of the first embodiment.

Figure 13:
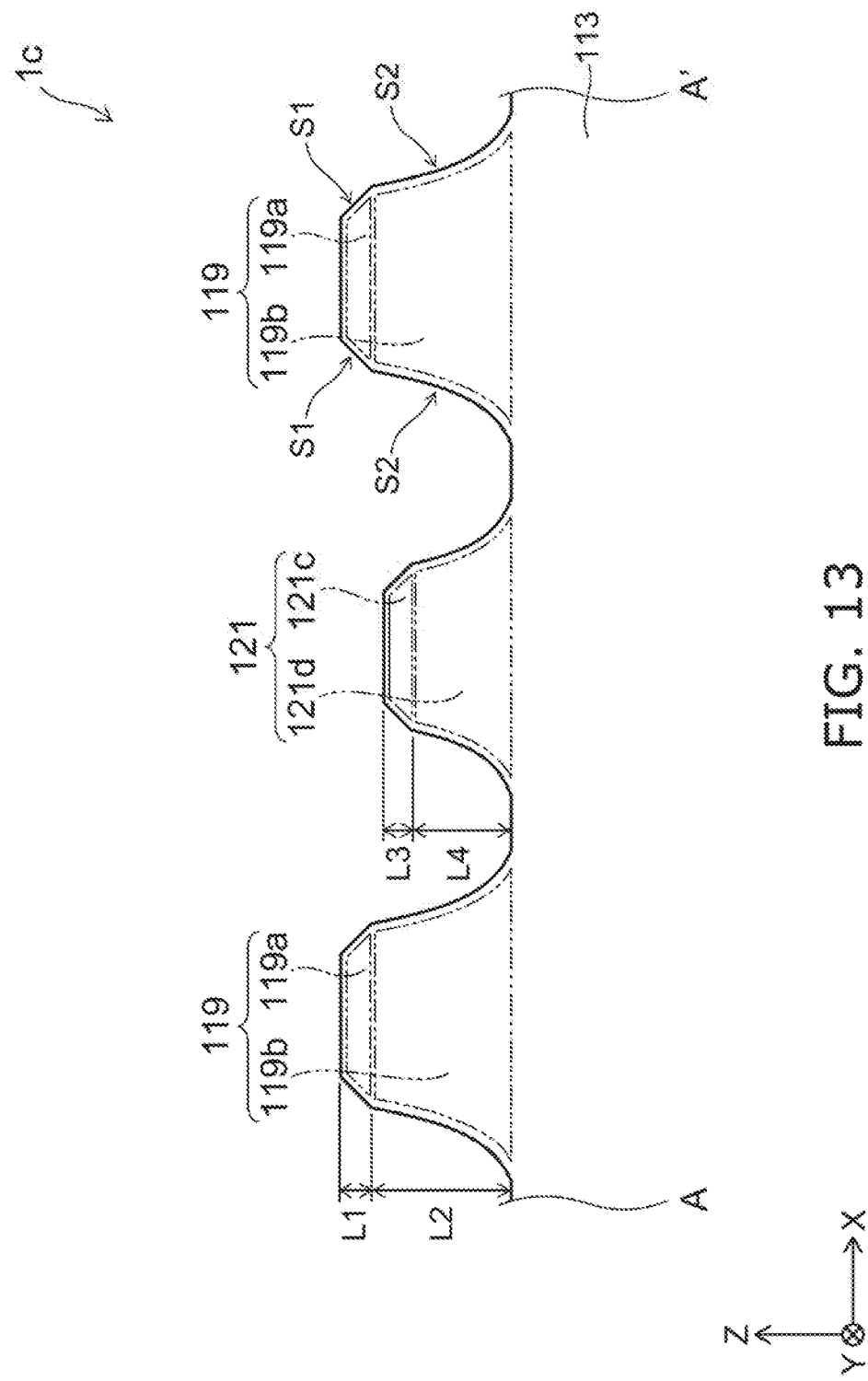
FIG. 13 is a sectional view taken along A-A' in FIG. 12.

FIG. 13 is a sectional view taken along A-A' in FIG. 12.

As shown in FIG. 12, a plurality of protrusions 119 and a plurality of protrusions 121 are provided on the upper surface of the stacked body LB. The width of the protrusion 121 is narrower than the width of the protrusion 119. In the X-Y plane, the spacing between the protrusion 119 and the protrusion 121 is wider than the spacing between the protrusions 119.

As shown in FIG. 13, the height of the protrusion 121 is lower than the height of the protrusion 119. More specifically, the length L4 in the Z-direction of the fourth portion 121d is shorter than the length L2 in the Z-direction of the second portion 119b. The length L3 in the Z-direction of the third portion 121c is shorter than the length L1 in the Z-direction of the first portion 119a.

Thus, the protrusion 121 having a lower height and a narrower width than the protrusion 119 is provided adjacent to the protrusion 119. This can further reduce the possibility that the light extracted from the protrusion 119 is incident into the stacked body LB from the protrusion 121 compared with the first variation and the second variation.

(Fourth Variation)

Figure 14:
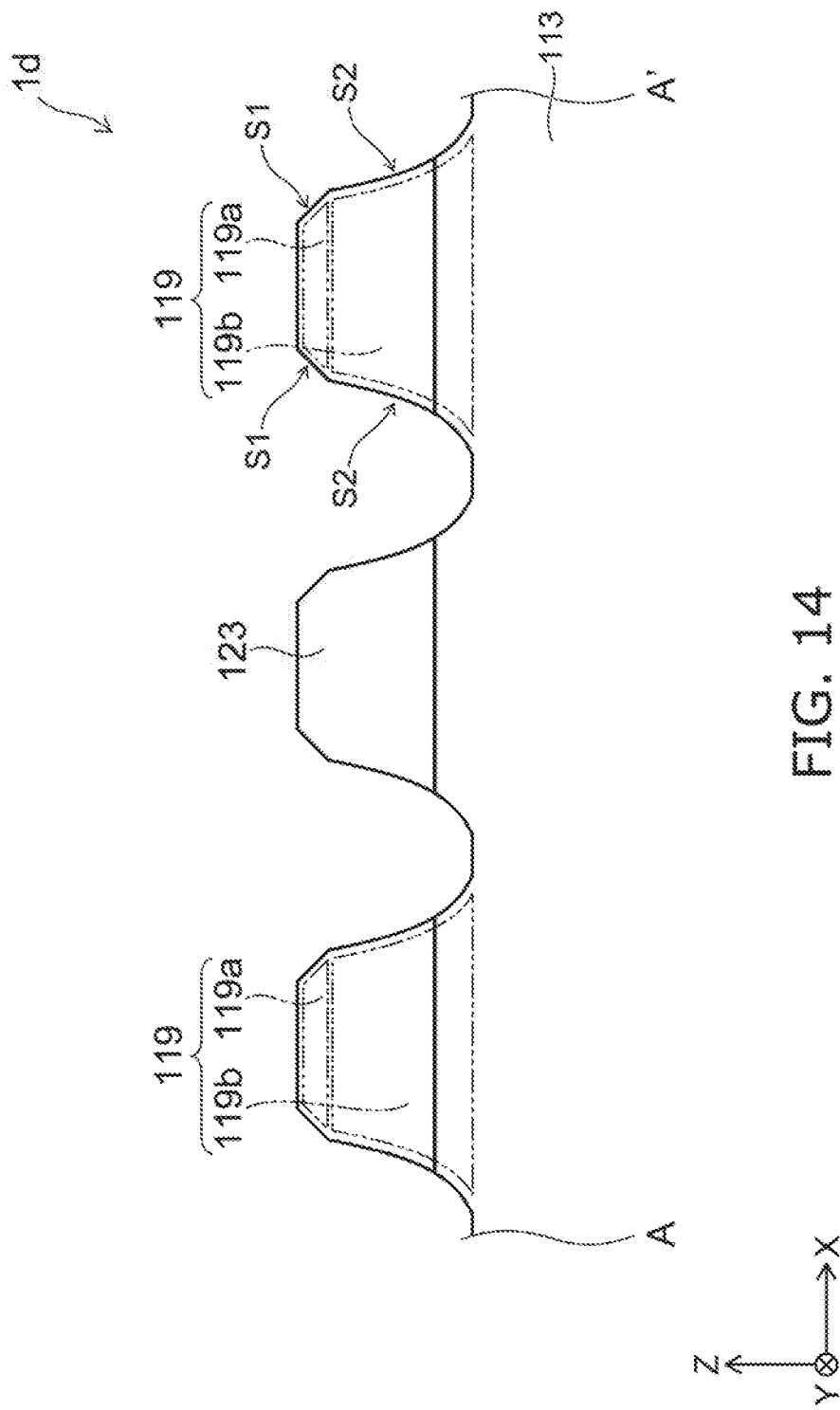
FIG. 14 is an enlarged sectional view showing part of the upper surface of a semiconductor light emitting device according to a third variation of the first embodiment.

FIG. 14 is an enlarged sectional view showing part of the upper surface of a semiconductor light emitting device 1d according to a third variation of the first embodiment.

In the semiconductor light emitting device 1d, the stacked body LB further includes a plurality of undoped semiconductor layers 123. The plurality of semiconductor layers 123 are spaced from each other on the n-type semiconductor layer 113. Part of the upper surface of the n-type semiconductor layer 113 is exposed through the gap between the semiconductor layers 123. The semiconductor layer 123 is e.g. an undoped gallium nitride layer. The n-type semiconductor layer 113 is connected to the n-side electrode 115 through the gap between the semiconductor layers 123.

As shown in FIG. 14, for instance, the first portion 119a of the protrusion 119 is composed of part of the semiconductor layer 123. Part of the second portion 119b is composed of another part of the semiconductor layer 123 and part of the n-type semiconductor layer 113.

The light absorption coefficient in the undoped semiconductor layer is smaller than the light absorption coefficient in the impurity-doped semiconductor layer. In the semiconductor light emitting device 1d, at least part of the protrusion 119 is composed of the semiconductor layer 123. This can improve the light extraction efficiency compared with the semiconductor light emitting device 1.

(Fifth Variation)

Figure 15:
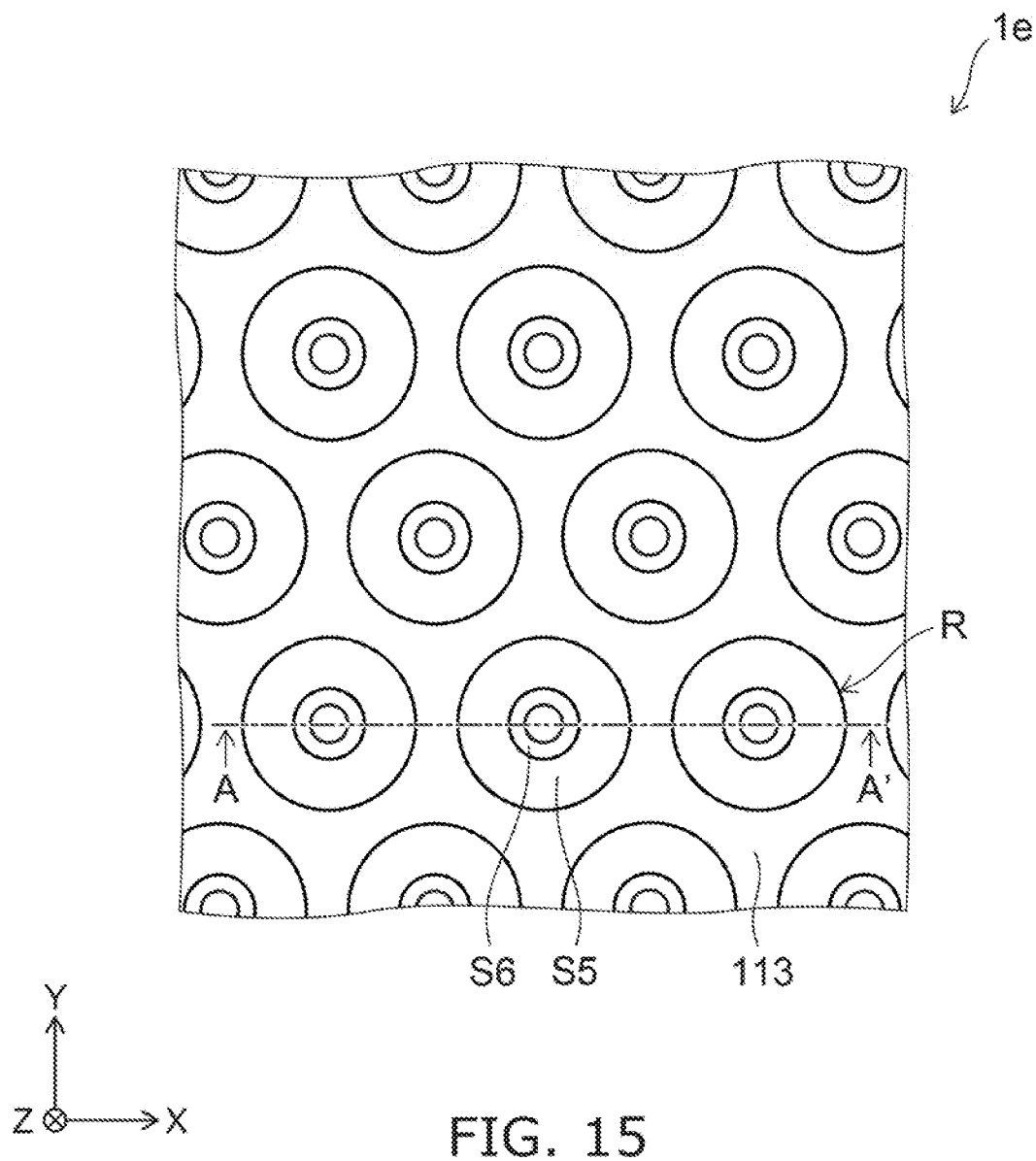
FIG. 15 is an enlarged plan view showing part of the upper surface of a semiconductor light emitting device according to a fifth variation of the first embodiment.

FIG. 15 is an enlarged plan view showing part of the upper surface of a semiconductor light emitting device 1e according to a fifth variation of the first embodiment.

Figure 16:
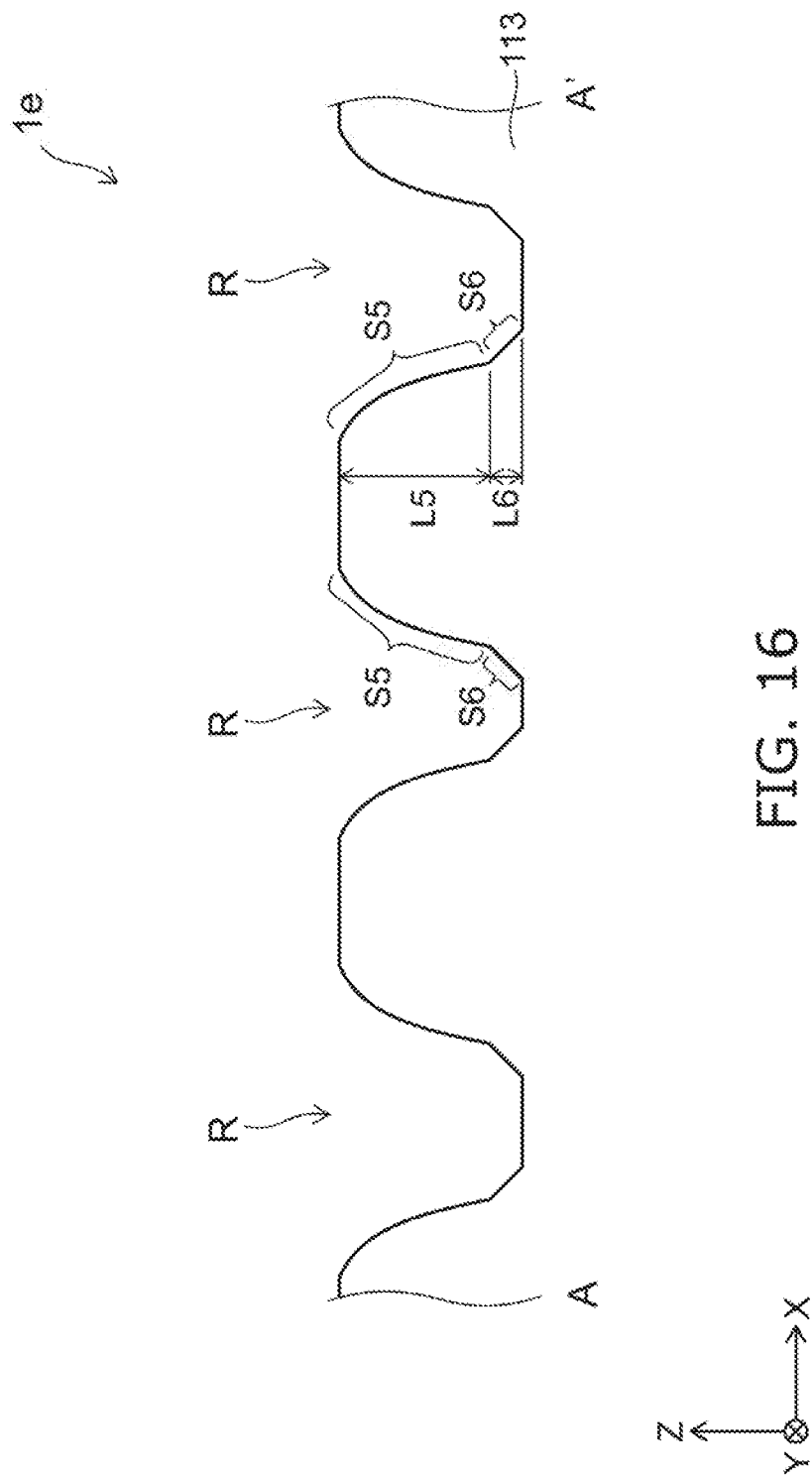
FIG. 16 is a sectional view taken along A-A' in FIG. 15.

FIG. 16 is a sectional view taken along A-A' in FIG. 15.

In the semiconductor light emitting device 1e, a plurality of recesses R are formed in the upper surface of the n-type semiconductor layer 113.

As shown in FIG. 15, the recesses R are provided in a plurality in the upper surface of the n-type semiconductor layer 113 along the X-Y plane. As an example, six recesses R are arranged around one recess R.

As shown in FIG. 16, the width of the recess R is narrowed downward. The recess R has a side surface S5 and a side surface S6 inclined with respect to the Z-direction. The side surface S5 is curved so as to be convex upward. The side surface S6 is located below the side surface S5.

In the recess R, the length L5 in the Z-direction of the portion having the side surface S5 is longer than the length L6 in the Z-direction of the portion having the side surface S6.

In the example shown in FIG. 16, the side surface S6 is uniformly inclined downward. However, the side surface S6 may be curved so as to be convex downward.

The light emitted from the light emitting layer 111 is extracted outside from the upper surface of the stacked body LB. The side surface S5 of the recess R is curved so as to be convex upward. Thus, the surface area of the upper surface of the stacked body LB can be made larger than in the case where the side surface of the recess R is uniformly inclined. That is, this variation can improve the efficiency of light extraction from the semiconductor light emitting device as in the semiconductor light emitting devices 1-1d.

Here, the length L5 is made longer than the length L6. This can further improve the efficiency of light extraction from the semiconductor light emitting device.

Also in this variation, as in the semiconductor light emitting device 1d, an undoped semiconductor layer 123 may be provided on the n-type semiconductor layer 113. The recess R may be formed in the semiconductor layer 123 and the n-type semiconductor layer 113.

Such a configuration can further improve the efficiency of light extraction from the semiconductor light emitting device.

Second Embodiment

Figure 17:
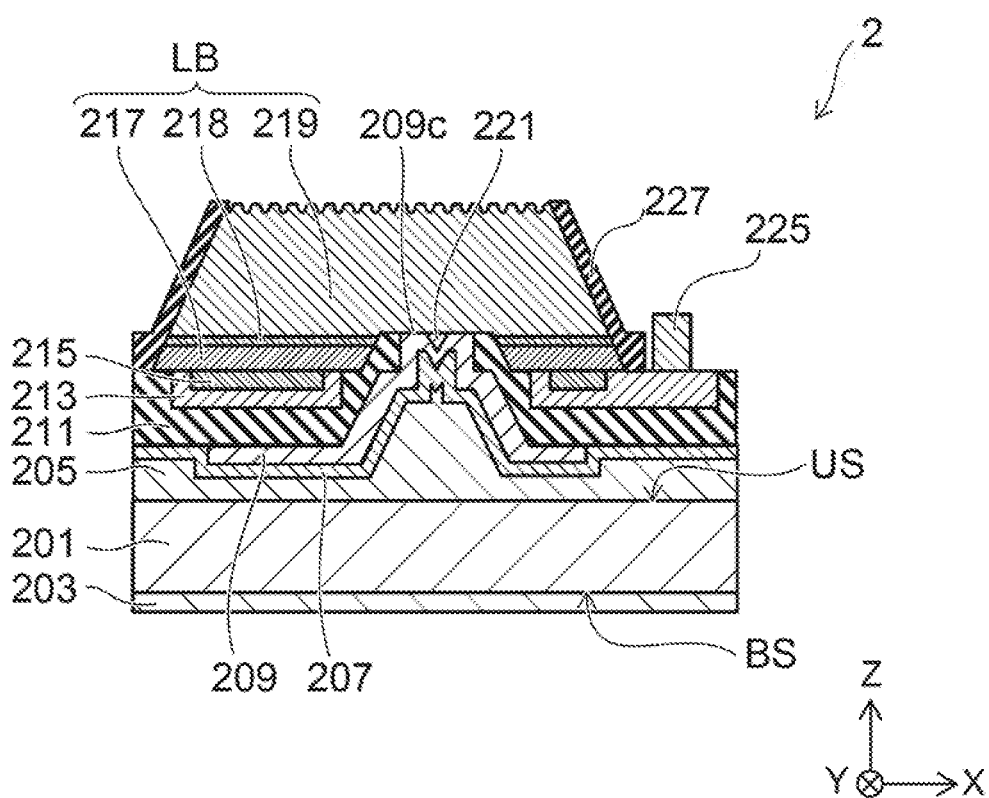
FIG. 17 is a sectional view of a semiconductor light emitting device according to a second embodiment.

FIG. 17 is a sectional view of a semiconductor light emitting device 2 according to a second embodiment.

The semiconductor light emitting device 2 is e.g. a light emitting diode of the lateral conduction type.

As shown in FIG. 17, the semiconductor light emitting device 2 includes a substrate 201, an n-side electrode 203, a metal layer 205, a barrier layer 207, an n-side contact layer 209, an insulating layer 211, a barrier layer 213, a p-side contact layer 215, a p-type semiconductor layer 217, a light emitting layer 218, a spacer 221, an n-type semiconductor layer 219, a p-side electrode 225, and a protective layer 227.

The substrate 201 is e.g. a silicon substrate. The substrate 201 has an upper surface US and a lower surface BS opposed to each other.

The n-side electrode 203 is provided on the lower surface BS of the substrate 201. The n-side electrode 203 contains e.g. metal such as gold, nickel, titanium, and aluminum.

The metal layer 205 is provided on the upper surface US of the substrate 201. The central part of the upper surface of the metal layer 205 protrudes toward the Z-direction. The metal layer 205 contains e.g. tin.

The barrier layer 207 is provided on the metal layer 205 along the upper surface of the metal layer 205. The central part of the upper surface of the barrier layer 207 protrudes toward the Z-direction like the metal layer 205. The barrier layer 207 has a structure in which e.g. a titanium layer and a platinum layer are stacked.

The n-side contact layer 209 is provided on part of the barrier layer 207. The protrusion 209c of the upper surface of the n-side contact layer 209 protrudes toward the Z-direction like the barrier layer 207. The n-side contact layer 209 is e.g. an aluminum layer.

The insulating layer 211 is provided on part of the barrier layer 207 and part of the n-side contact layer 209. The protrusion 209c of the n-side contact layer 209 is surrounded with the insulating layer 211 along the X-Y plane. However, the upper surface of the protrusion 209c is not covered with the insulating layer 211. The insulating layer 211 contains an insulating material such as silicon oxide or silicon nitride.

The barrier layer 213 is provided on the insulating layer 211. The barrier layer 213 is shaped like a ring and provided around the protrusion 209c along the X-Y plane. The barrier layer 213 has a structure in which e.g. a titanium layer and a gold layer are stacked.

The p-side contact layer 215 is provided on the barrier layer 213. The p-side contact layer 215 is e.g. a silver layer.

The p-type semiconductor layer 217 is provided on the barrier layer 213 and the p-side contact layer 215. The p-type semiconductor layer 217 is in ohmic contact with the p-side contact layer 215. The p-type semiconductor layer 217 is made of e.g. gallium nitride containing p-type impurity.

The light emitting layer 218 is provided on the p-type semiconductor layer 217. The light emitting layer 218 is e.g. an undoped gallium nitride layer. The p-side contact layer 215, the p-type semiconductor layer 217, and the light emitting layer 218 are provided like a ring around the protrusion 209c like the barrier layer 213.

The spacer 221 is provided on part of the protrusion 209c. The spacer 221 contains e.g. silicon oxide or silicon nitride.

The n-type semiconductor layer 219 is provided on the light emitting layer 218, the protrusion 209c, and the spacer 221. The n-type semiconductor layer 219 is in ohmic contact with the n-side contact layer 209. The n-type semiconductor layer 219 is e.g. a gallium nitride layer containing n-type impurity.

Each side surface of the p-type semiconductor layer 217, the light emitting layer 218, and the n-type semiconductor layer 219 is covered with the protective layer 227. The protective layer 227 contains e.g. silicon nitride.

The p-side electrode 225 is provided on the barrier layer 213 and spaced from the p-type semiconductor layer 217. The p-side electrode 225 is electrically connected to the p-side contact layer 215 via the barrier layer 213. The p-side electrode 225 contains metal such as gold, nickel, titanium, and aluminum.

Figure 18:
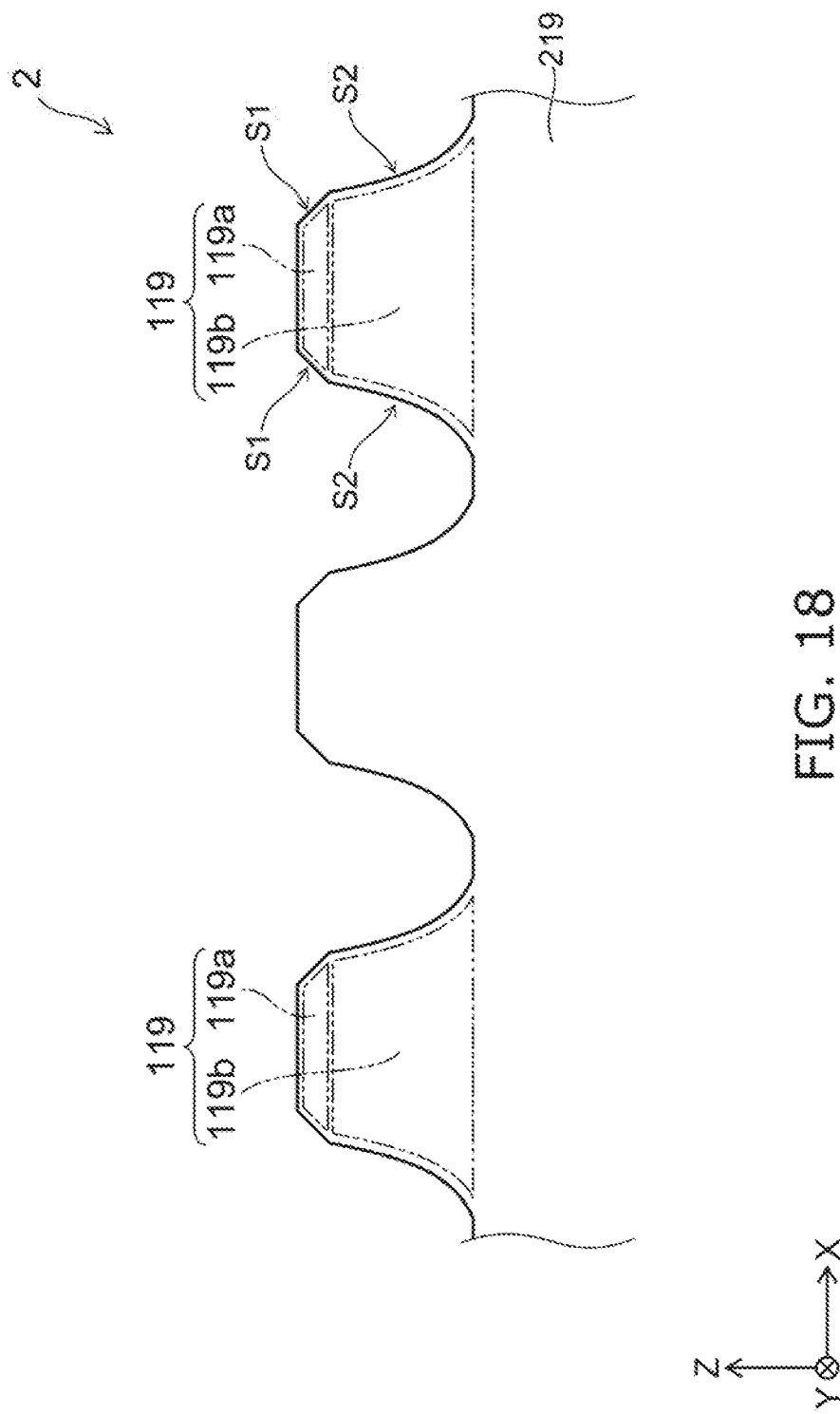
FIG. 18 is an enlarged sectional view showing part of the upper surface of the semiconductor light emitting device according to the second embodiment.

FIG. 18 is an enlarged sectional view showing part of the upper surface of the semiconductor light emitting device 2 according to the second embodiment.

More specifically, FIG. 18 shows the structure of a portion of the upper surface of the n-type semiconductor layer 219 which is not covered with the protective layer 227 and from which light is extracted outside.

As shown in FIG. 18, a plurality of protrusions 119 are provided on the upper surface of the n-type semiconductor layer 219 as in the semiconductor light emitting device 1. The protrusion 119 has a first portion 119a and a second portion 119b. The side surface S1 and the side surface S2 are inclined with respect to the Z-direction. The side surface S2 is curved so as to be convex downward.

Also in this embodiment, as in the first embodiment, a plurality of protrusions 119 are provided on the upper surface of the stacked body LB. Thus, the surface area of the upper surface of the stacked body LB can be increased. This can improve the efficiency of light extraction from the semiconductor light emitting device.

As in the variations of the first embodiment, a plurality of protrusions 119 and a plurality of protrusions 121 may be provided on the upper surface of the stacked body LB.

Here, the semiconductor light emitting device has been described with reference to an example in which an n-side electrode is provided on the lower surface of the substrate 201 and a p-side electrode 225 is provided on the lateral side of the stacked body LB. However, the invention according to this embodiment is also applicable to the semiconductor light emitting device in which the positional relationship of the n-side electrode and the p-side electrode is reversed.

(First Variation)

Figure 19:
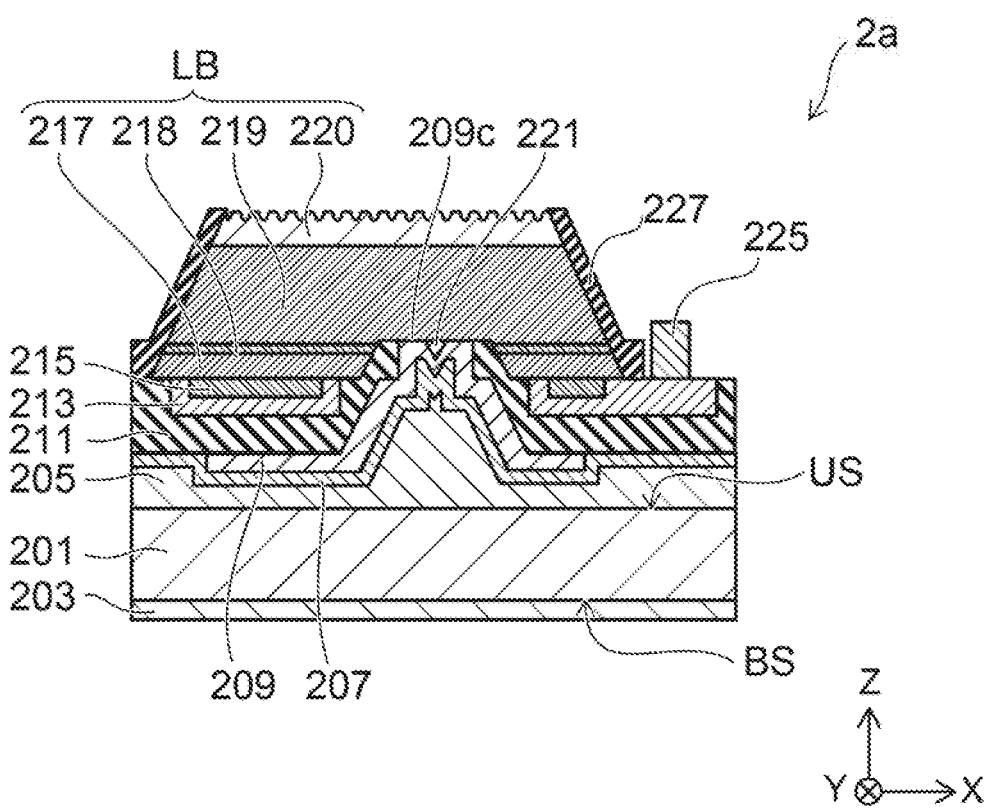
FIG. 19 is a sectional view of a semiconductor light emitting device according to a first variation of the second embodiment.

FIG. 19 is a sectional view of a semiconductor light emitting device 2a according to a first variation of the second embodiment.

Figure 20:
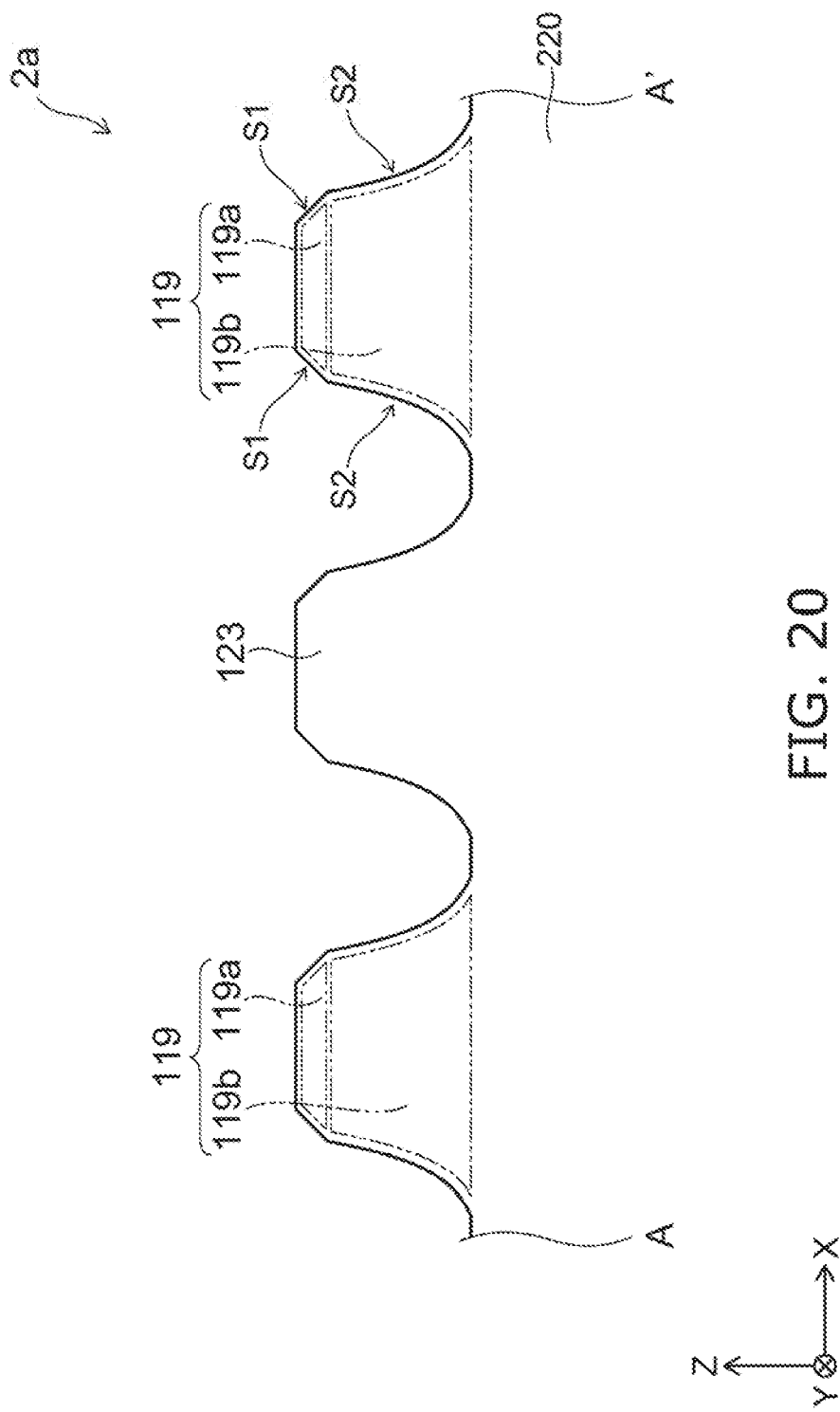
FIG. 20 is an enlarged sectional view showing part of the upper surface of the semiconductor light emitting device according to the first variation of the second embodiment.

FIG. 20 is an enlarged sectional view showing part of the upper surface of the semiconductor light emitting device 2a according to the first variation of the second embodiment.

As shown in FIG. 19, in the semiconductor light emitting device 2a, an undoped semiconductor layer 220 is provided on the n-type semiconductor layer 219. The semiconductor layer 220 is e.g. an undoped gallium nitride layer. The stacked body LB includes the p-type semiconductor layer 217, the light emitting layer 218, the n-type semiconductor layer 219, and the semiconductor layer 220.

As shown in FIG. 20, a plurality of protrusions 119 are provided on the upper surface of the semiconductor layer 220 as in the semiconductor light emitting device 2.

The light absorption coefficient in the undoped semiconductor layer is smaller than the light absorption coefficient in the impurity-doped semiconductor layer. In the semiconductor light emitting device according to this variation, an undoped semiconductor layer 220 is provided on the n-type semiconductor layer 219. Light is extracted outside from the upper surface of the semiconductor layer 220. Thus, this variation can improve the external light extraction efficiency compared with the semiconductor light emitting device 2.

(Second Variation)

Figure 21:
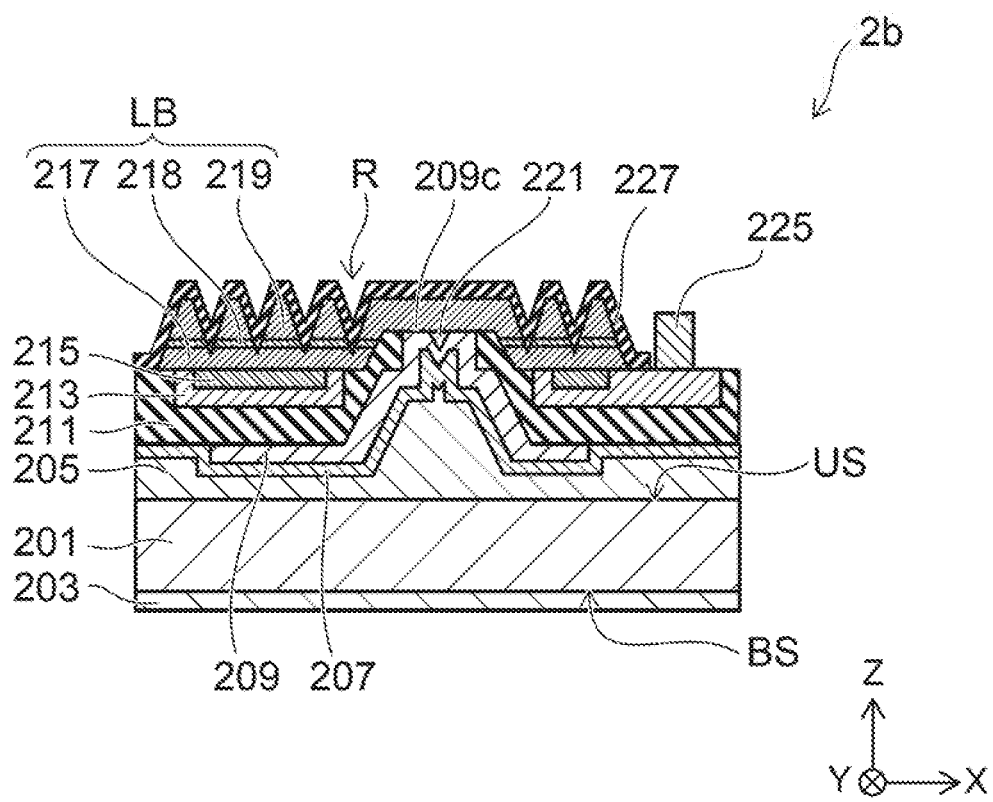
FIG. 21 is a sectional view of a semiconductor light emitting device according to a second variation of the second embodiment.

FIG. 21 is a sectional view of a semiconductor light emitting device 2b according to a second variation of the second embodiment.

Figure 22:
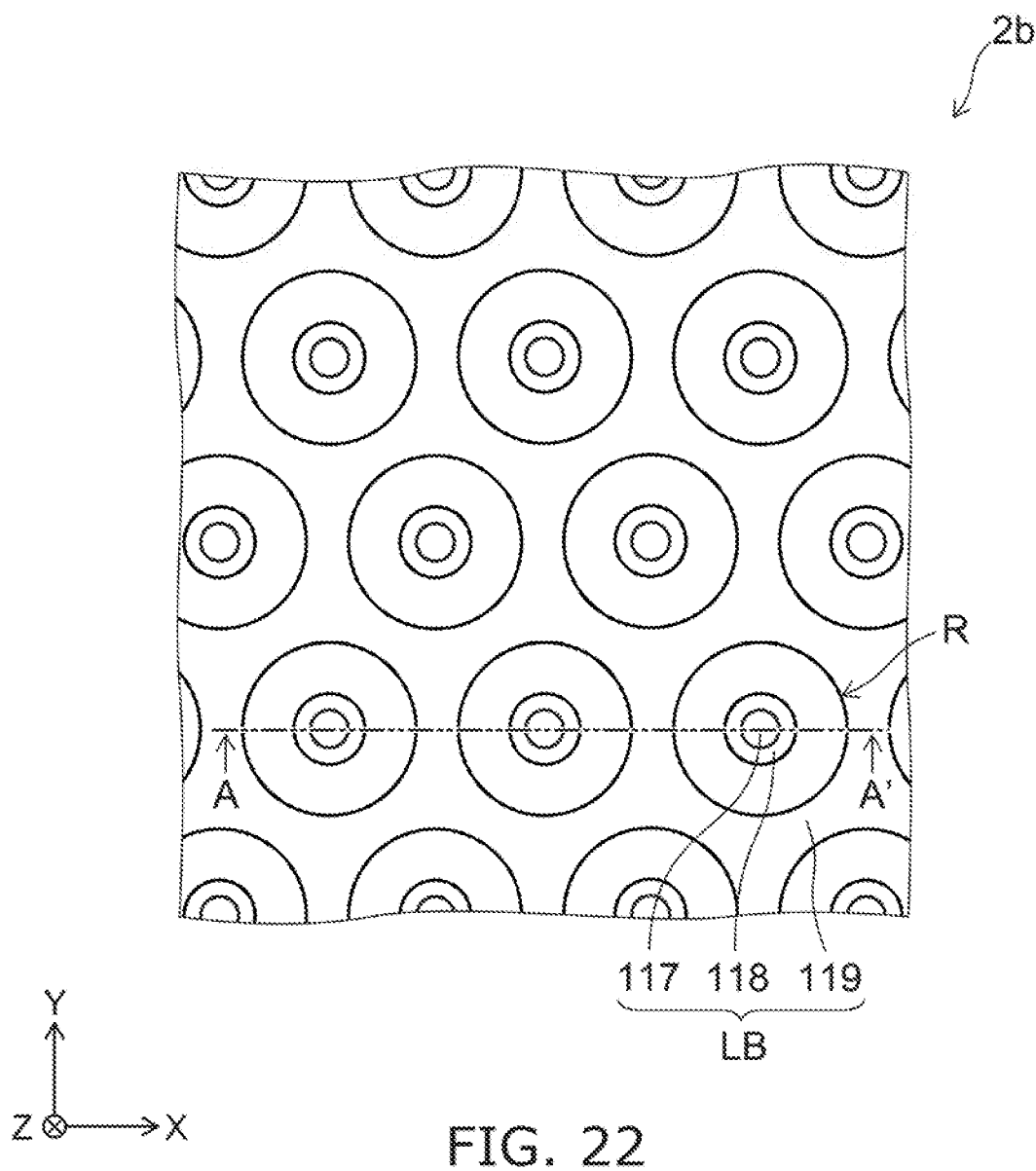
FIG. 22 is a partially enlarged plan view of the stacked body LB of the semiconductor light emitting device according to the second variation of the second embodiment.

FIG. 22 is a partially enlarged plan view of the stacked body LB of the semiconductor light emitting device 2b according to the second variation of the second embodiment.

Figure 23:
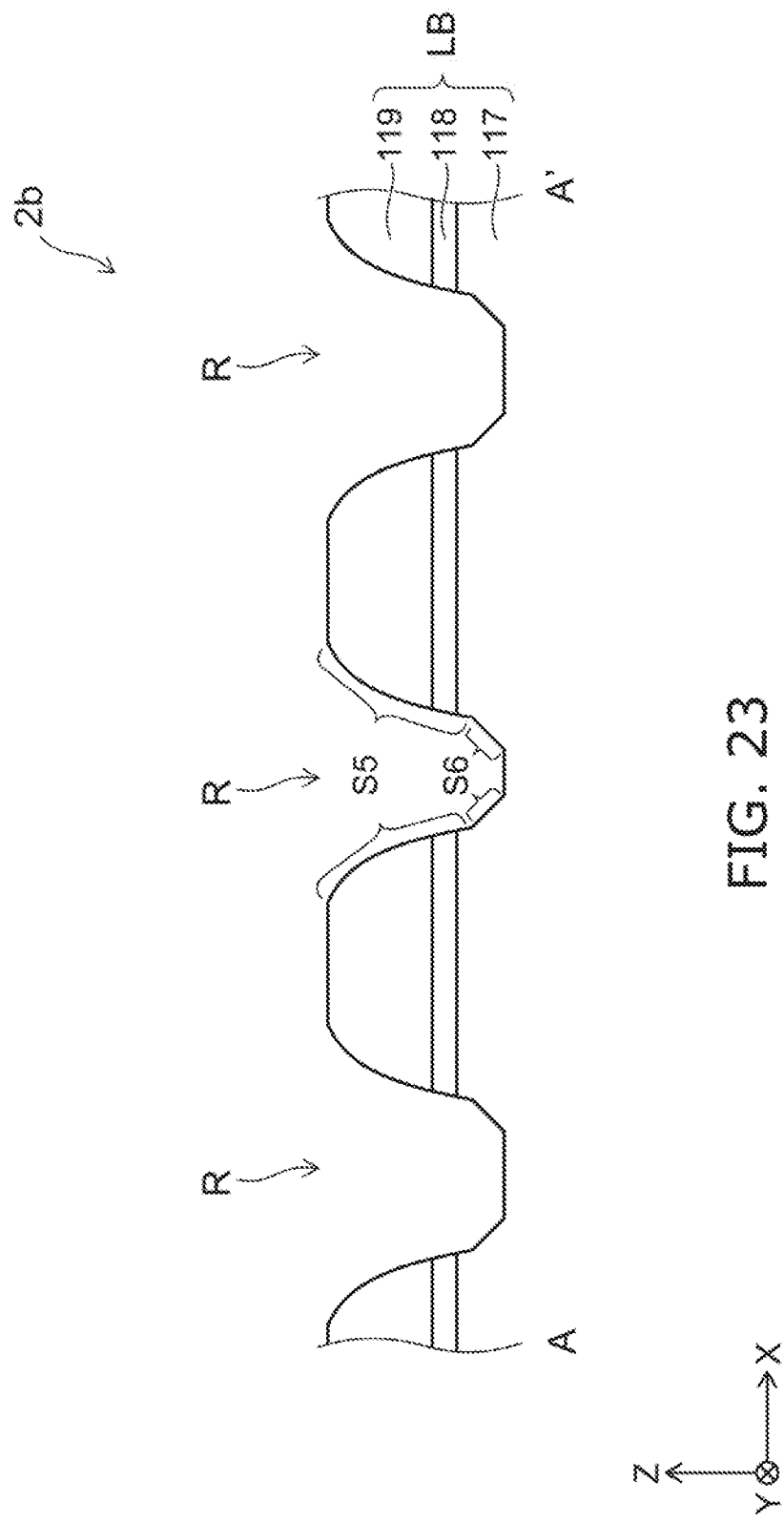
FIG. 23 is a sectional view taken along A-A' in FIG. 22.

FIG. 23 is a sectional view taken along A-A' in FIG. 22. The protective layer 227 is omitted in FIG. 22.

In the semiconductor light emitting device 2b, a plurality of recesses R are formed in the upper surface of the stacked body LB including the p-type semiconductor layer 217, the light emitting layer 218, and the n-type semiconductor layer 219. Preferably, as shown in FIG. 21, the recess R is formed on the region other than the protrusion 209c to prevent etching of the protrusion 209c of the n-side contact layer 209. Part of the p-type semiconductor layer 217 and part of the light emitting layer 218 are exposed outside the stacked body LB through the recess R. A protective layer 227 is provided along the upper surface of the stacked body LB to prevent external exposure of the light emitting layer 218. Part of the protective layer 227 is provided inside the recess R in the upper surface of the stacked body LB.

As shown in FIG. 22, the recesses R are provided in a plurality in the upper surface of the stacked body LB along the X-Y plane. As an example, six recesses R are arranged around one recess R.

As shown in FIG. 23, the width of the recess R is narrowed downward. The recess R has a side surface S5 and a side surface S6 inclined with respect to the Z-direction. The side surface S5 is curved so as to be convex upward. The side surface S6 is located below the side surface S5.

In the example shown in FIG. 23, the side surface of the light emitting layer 118 is included in the side surface S5. However, the side surface of the light emitting layer 118 may be included in the side surface S6.

The light emitted from the light emitting layer 118 is injected from the stacked body LB into the protective layer 227 and extracted outside from the upper surface of the protective layer 227. The side surface S5 of the recess R is curved so as to be convex upward. Thus, the surface area of the upper surface of the stacked body LB can be made larger than in the case where the side surface of the recess R is uniformly inclined. That is, this variation can improve the efficiency of light extraction from the stacked body LB to the protective layer 227. Thus, the efficiency of light extraction from the semiconductor light emitting device can be improved.

Part of the side surface of the recess R is curved so as to be convex upward. In this case, the side surface S5 located above is curved. This can reduce the possibility that the light injected from the side surface of the recess R into the protective layer 227 is incident into the stacked body LB through the side surface of the recess R compared with the case where the side surface S6 is curved.

The recess R having the side surface S5 is provided in the upper surface of the stacked body LB. Thus, when the surface area of the upper surface of the stacked body LB is increased, the region of the n-type semiconductor layer 119 having a thick film thickness can be made larger than in the case where a protrusion is formed on the upper surface of the stacked body LB. This can reduce the electrical resistance in the n-type semiconductor layer 119 and reduce the power consumption of the semiconductor light emitting device. Alternatively, by the amount of reducing the electrical resistance in the n-type semiconductor layer 119, the film thickness of the n-type semiconductor layer 119 can be thinned, and the semiconductor light emitting device can be downsized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

REFERENCE SIGNS LIST 1, 1a-1e, 2, 2a, 2b semiconductor light emitting device
109 p-type semiconductor layer
111 light emitting layer
113 n-type semiconductor layer
119, 121 protrusion
123 semiconductor layer
217 p-type semiconductor layer
218 light emitting layer
219 n-type semiconductor layer

220 semiconductor layer
LB stacked body
R recess

The invention claimed is:

1. A semiconductor light emitting device comprising:
a stacked body including a first semiconductor layer of a first conductivity type, a light emitting layer provided on the first semiconductor layer, and a second semiconductor layer of a second conductivity type provided on the light emitting layer, the stacked body including a first protrusion and a second protrusion on an upper surface of the stacked body, the first protrusion and the second protrusion protruding in a first direction from the first semiconductor layer to the light emitting layer, widths of the first protrusion and the second protrusion in a second direction perpendicular to the first direction decreasing toward the first direction, and the first protrusion including:
 a first portion having a first side surface inclined with respect to the first direction; and
 a second portion provided below the first portion and having a second side surface inclined with respect to the first direction, the second side surface being curved so as to be convex downward,
the second protrusion including:
 a third portion having a third side surface inclined with respect to the first direction; and
 a fourth portion provided below the third portion and having a fourth side surface inclined with respect to the first direction, the fourth side surface being curved so as to be convex downward,
length of the first protrusion in the first direction being longer than length of the second protrusion in the first direction.

2. The device according to claim 1, therein length in the first direction of the second portion is longer than length in the first direction of the first portion.

3. The device according to claim 1, wherein inclination of at least part of the second side surface with respect to the first direction is smaller than inclination of the first side surface with respect to the first direction.

4. The device according to claim 1, wherein length in the first direction of the first portion is longer than length in the first direction of the third portion.

5. The device according to claim 1, wherein
inclination of at least part of the fourth side surface with respect to the first direction is smaller than inclination of the third side surface with respect to the first direction, and
width in a second direction perpendicular to the first direction of the first protrusion at a first position in the first direction is longer than width in the second direction of the second protrusion at the first position.

6. The device according to claim 5, wherein length in the first direction of the first portion is longer than length in the first direction of the third portion.

7. The device according to claim 1, wherein
the stacked body further includes an undoped third semiconductor layer provided on the second semiconductor layer, and
the first protrusion is formed on an upper surface of the third semiconductor layer.

8. The device according to claim 1, wherein
the stacked body further includes an undoped third semiconductor layer provided on the second semiconductor layer, and
at least part of the first portion is at least part of the third semiconductor layer.

9. The device according to claim 1, wherein at least part of the second portion is at least part of the first semiconductor layer.

10. The device according to claim 1, wherein the first side surface is curved so as to be convex upward.

* * * * *